(12) United States Patent
Ohashi et al.

(10) Patent No.: US 9,991,179 B2
(45) Date of Patent: Jun. 5, 2018

(54) METHOD OF MANUFACTURING SEMICONDUCTOR DEVICE

(71) Applicant: HITACHI KOKUSAI ELECTRIC INC., Toyama-shi (JP)

(72) Inventors: Naofumi Ohashi, Toyama (JP); Kazuyuki Toyoda, Toyama (JP); Satoshi Shimamoto, Toyama (JP); Toshiyuki Kikuchi, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days. days.

(21) Appl. No.: 15/265,371

(22) Filed: Sep. 14, 2016

(65) Prior Publication Data
US 2017/0358506 A1 Dec. 14, 2017

(30) Foreign Application Priority Data
Jun. 10, 2016 (JP) ................. 2016-116351

(51) Int. Cl.
| | |
|---|---|
| H01L 21/302 | (2006.01) |
| H01L 21/461 | (2006.01) |
| H01L 21/66 | (2006.01) |
| H01L 21/3213 | (2006.01) |
| H01L 21/768 | (2006.01) |

(52) U.S. Cl.
CPC ........ *H01L 22/26* (2013.01); *H01L 21/32136* (2013.01); *H01L 21/7684* (2013.01)

(58) Field of Classification Search
USPC ............................................ 216/60; 438/720
See application file for complete search history.

(56) References Cited

U.S. PATENT DOCUMENTS

2006/0213864 A1* 9/2006 Tahara ............. H01J 37/32935
216/58

FOREIGN PATENT DOCUMENTS

JP        2006-334703 A      12/2006

* cited by examiner

*Primary Examiner* — Roberts Culbert
(74) *Attorney, Agent, or Firm* — Volpe and Koenig, P.C.

(57) ABSTRACT

Provided is a technique capable of obtaining a satisfactory yield for a semiconductor device with an air gap. The technique includes a method of manufacturing a semiconductor device, including: (a) receiving a thickness information of a wiring layer formed on a substrate including: a first interlayer insulation film; and the wiring layer disposed on the first interlayer insulation film, the wiring layer including: copper-containing films used as wiring; and an inter-wiring insulation film having trenches filled with the copper-containing films and insulating the copper-containing films; (b) placing the substrate on a substrate support installed in a process chamber; and (c) etching the wiring layer using an etching gas based on an etching control value corresponding to the thickness information of the wiring layer.

17 Claims, 20 Drawing Sheets

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2016-116351, filed on Jun. 10, 2016, the entire contents of which are hereby incorporated by reference.

BACKGROUND

1. Field

The present disclosure relates to a method of manufacturing a semiconductor device.

2. Description of the Related Art

Recently, with high integration of semiconductor devices, the distance between wirings has been reduced. The reduction in distance may increase the capacitance between the wirings, thereby causing a problem such as reduction in propagation velocity of a signal. Therefore, the dielectric constant between the wirings needs to be lowered.

An air gap structure having a void formed between wirings is being researched as one of methods for lowering the dielectric constant. Examples of the method of forming a void may include performing an etching process between the wirings. The method of forming an air gap is described in Patent Document 1, for example.

RELATED ART DOCUMENT

Patent Document

Patent Document 1: Japanese Patent Publication No. 2006-334703

In the air gap structure according to the related art, an electric field becomes strong for a portion of a wring. The capacitance of the portion may be increased. In this case, a problem such as yield reduction may occur.

SUMMARY

Described herein is a technique capable of obtaining a satisfactory yield for a semiconductor device with an air gap.

According to one aspect, a method of manufacturing a semiconductor device includes: (a) receiving a thickness information of a wiring layer formed on a substrate including: a first interlayer insulation film; and the wiring layer disposed on the first interlayer insulation film, the wiring layer including: copper-containing films used as wiring; and an inter-wiring insulation film having trenches filled with the copper-containing films and insulating the copper-containing films; (b) placing the substrate on a substrate support installed in a process chamber; and (c) etching the wiring layer using an etching gas based on an etching control value corresponding to the thickness information of the wiring layer.

DETAILED DESCRIPTION OF THE PREFERRED EMBODIMENTS

First Embodiment

Hereafter, a first embodiment will be described.

Figure 1:
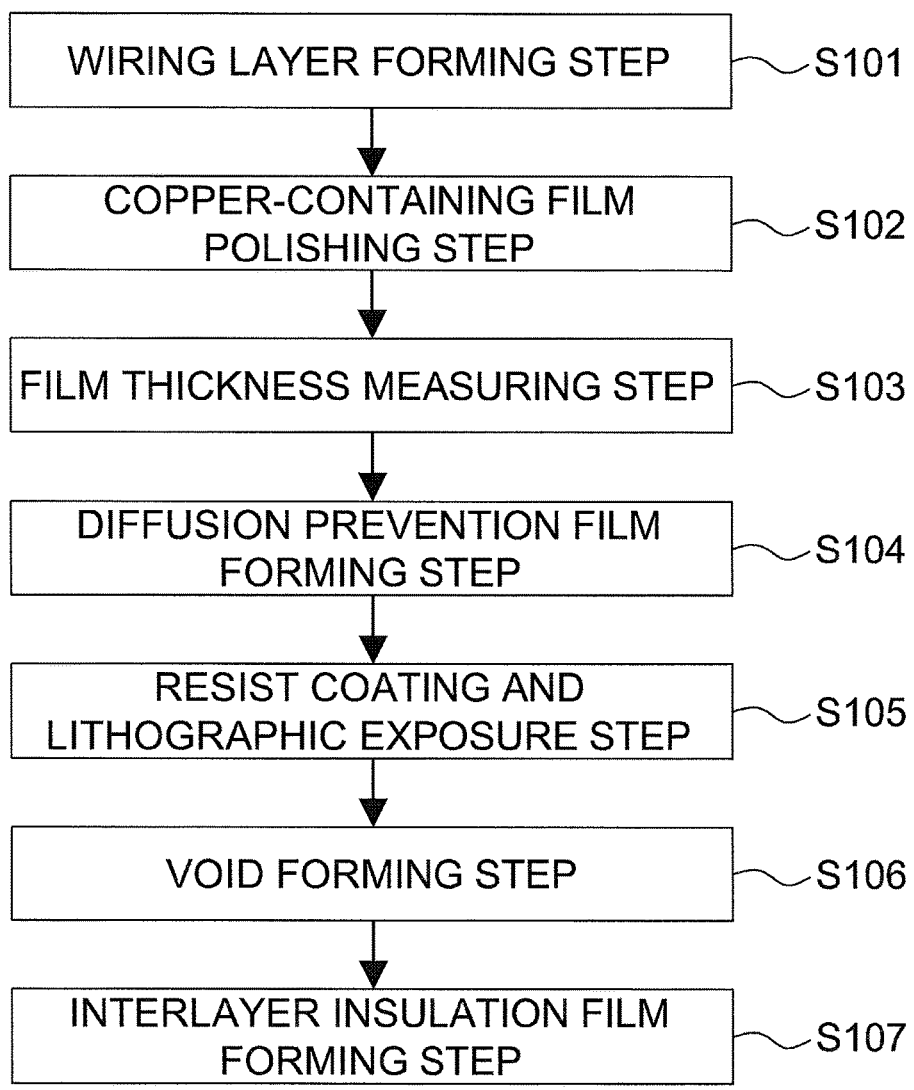
FIG. 1 is a diagram illustrating a manufacturing flow of a semiconductor device according to a first embodiment described herein.

Referring to FIG. 1, a method of manufacturing a semiconductor device will be described.

[Wiring Layer Forming Step S101]

Figure 2:
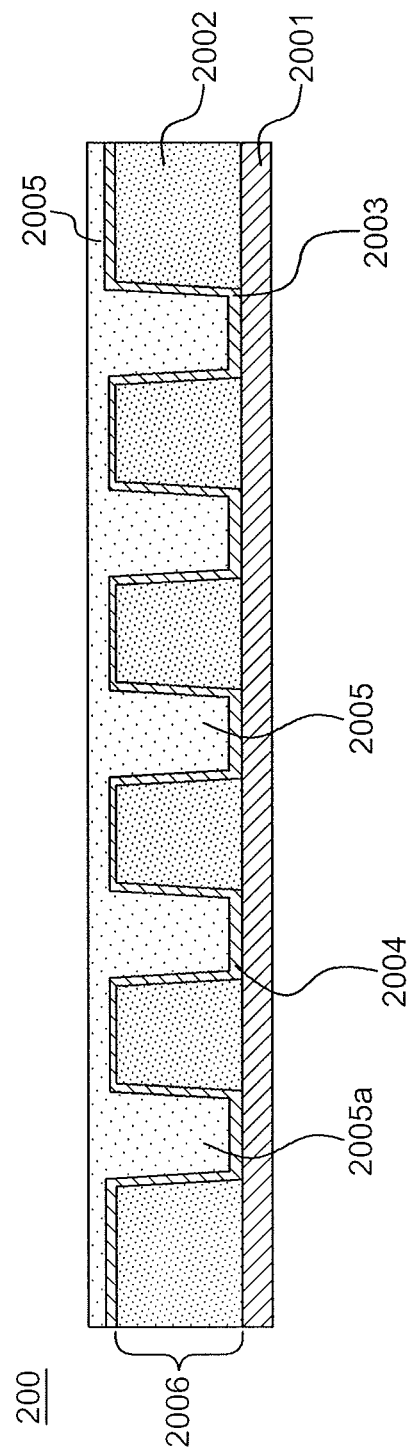
FIG. 2 is a diagram illustrating a wafer according to the first embodiment described herein.

A wiring layer forming step S101 will be described with reference to FIG. 2. FIG. 2 is a diagram illustrating a wiring layer 200b formed in a semiconductor wafer 200. The wiring layer 200b is formed on a first interlayer insulation film 2001. An electrode layer (not illustrated) includes components such as a gate electrode and an anode, and is disposed under the first interlayer insulation film 2001.

The first interlayer insulation film 2001 is a porous carbon-containing silicon (SiOC) film, for example. An inter-wiring insulation film 2002 is formed on the first interlayer insulation film 2001. The inter-wiring insulation film 2002 is a SiOC film, for example.

The inter-wiring insulation film 2002 has a plurality of trenches 2003 formed therein. A barrier film 2004 is formed on the surfaces of the trenches 2003. The barrier film 2004 is a tantalum nitride (TaN) film, for example.

A copper-containing film 2005 is formed on the barrier film 2004 by a method such as sputtering. The copper-containing film 2005 is used as a wiring afterwards. For the uniformity at the surface of a substrate, characteristics such as resistance values of the respective wirings need to be uniformized. Thus, the trenches 2003 need to be filled with the copper-containing film 2005, for example. The copper-containing film 2005 is formed such that the upper end thereof is positioned at a higher level than the upper end of the trench 2003, that is, the copper-containing film 2005 protrudes from the upper end of the trench 2003.

In the first embodiment, the copper-containing film 2005 in the trench 2003 is referred to as a copper-containing film 2005a, and a portion of the copper-containing film 2005, protruding from the upper end of the trench 2003, is referred to as a copper-containing film 2005b. The copper-containing film 2005 is constituted of copper, for example.

[Copper-Containing Film Polishing Step S102]

The respective portions of the copper-containing film 2005 are physically and electrically connected to each other on the wiring layer 2006. In order to insulate the adjacent copper-containing films 2005a from each other, the wiring layer 2006 is polished by a polishing apparatus. Specifically, the copper-containing film 2005b is polished.

Figure 3:
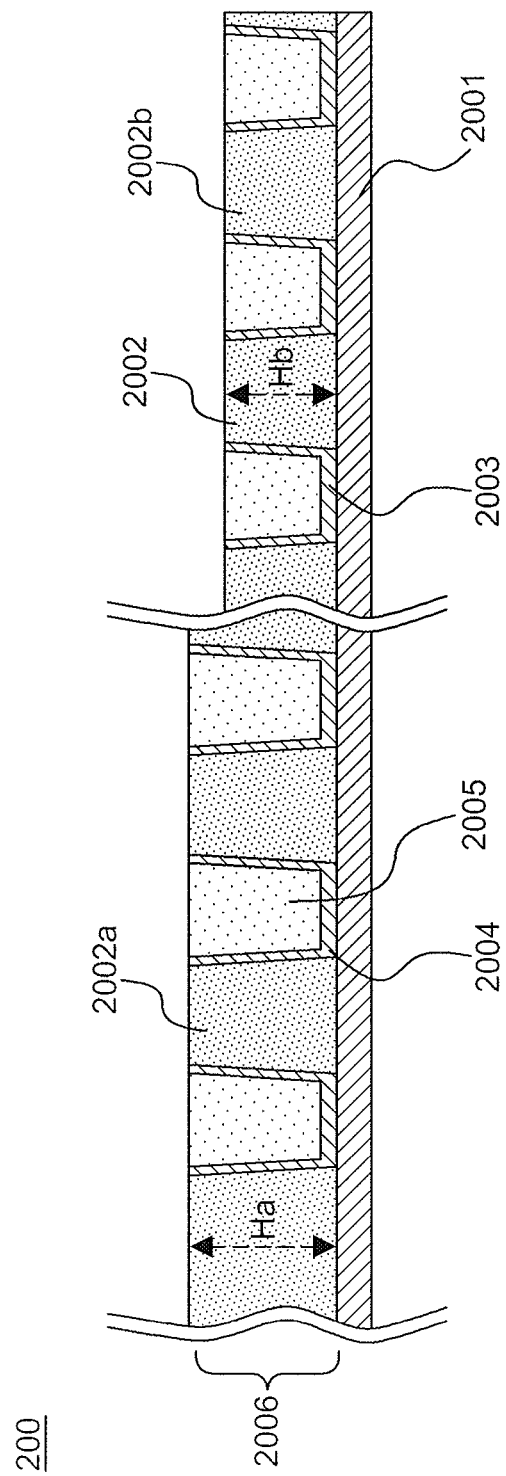
FIG. 3 is a diagram illustrating a processed state of the wafer according to the first embodiment described herein.

In order to reliably insulate the adjacent copper-containing films 2005a from each other, the copper-containing film 2005b on the wiring layer 2006 is removed by polishing the wiring layer 2006 to a position lower than the upper end of the inter-wiring insulation film 2002 as illustrated in FIG. 3.

Figure 4:
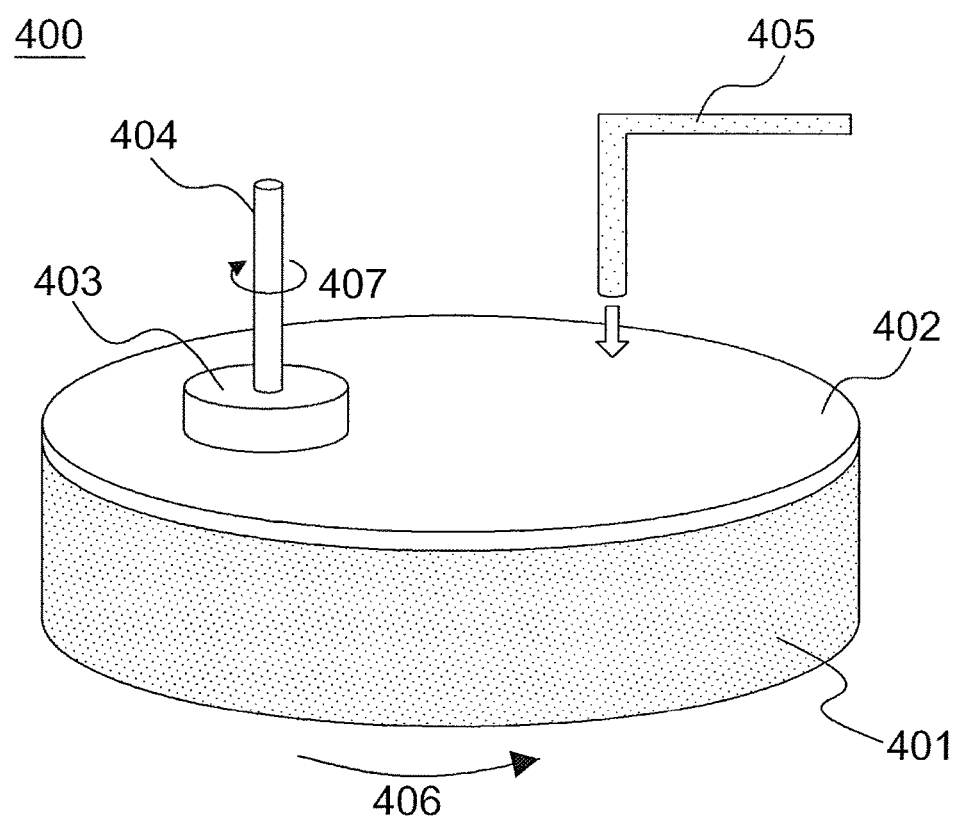
FIG. 4 is a diagram illustrating a polishing apparatus according to the first embodiment described herein.
Figure 5:
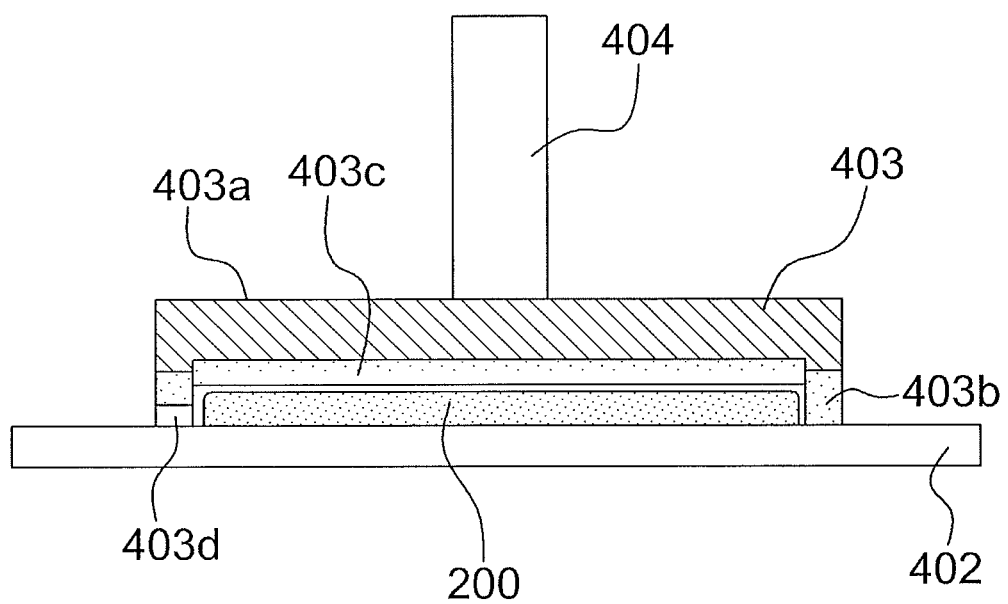
FIG. 5 is a diagram illustrating the polishing apparatus according to the first embodiment described herein.

Referring to FIGS. 4 and 5, the polishing apparatus 400 will be described. In FIG. 4, reference numeral 401 denotes a polishing board, and reference numeral 402 denotes polishing cloth. The polishing board 401 is connected to a rotating mechanism (not illustrated), and rotated along the direction of an arrow 406 when polishing the wafer 200.

Reference numeral 403 denotes a polishing head, and a shaft 404 is connected to the upper surface of the polishing head 403. The shaft 404 is connected to the rotating mechanism (not illustrated) and a vertical driving mechanism (not illustrated). While the wafer 200 is polished, the shaft 404 is rotated along the direction of an arrow 407.

Reference numeral 405 denotes a supply pipe for supplying slurry (polishing agent). While the wafer 200 is polished, slurry is supplied toward the polishing cloth 402 from the supply pipe 405.

Next, referring to FIG. 5, the polishing head 403 and the neighboring structure thereof will be described in detail. FIG. 5 is a cross-sectional view illustrating the polishing head 403 and the neighboring structure thereof. The polishing head 403 includes a top ring 403a, a retainer ring 403b and an elastic mat 403c. While the wafer 200 is polished, the retainer ring 403b surrounds the wafer 200, and the elastic mat 403c presses the wafer 200 against the polishing cloth 402. The retainer ring 403b has a trench 403d through which slurry is passed, the trench 403d being formed from the outside toward the inside of the retainer ring 403b. At this time, a plurality of trenches 403d may be circumferentially disposed according to the shape of the retainer ring 403b. Fresh slurry (not used) and used slurry are exchanged through the trenches 403d.

Next, a copper-containing film polishing step S102 will be described. When the wafer 200 is loaded into the polishing head 403, slurry is supplied through the supply pipe 405, and the polishing board 401 and the polishing head 403 are rotated. Then, slurry is supplied into the retainer ring 403b, and polishes the surface of the wafer 200. Such a polishing process can remove the copper-containing film 2005b as illustrated in FIG. 3. After being polished for a predetermined time, the wafer 200 is unloaded.

Figure 6:
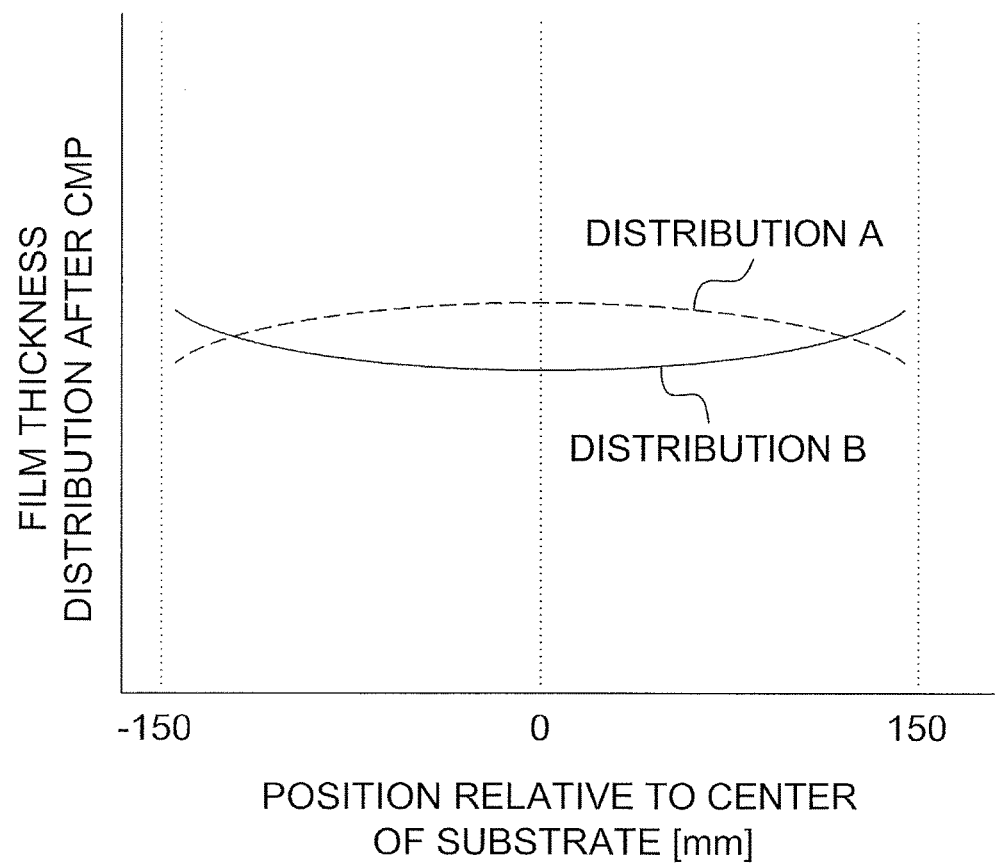
FIG. 6 is a diagram illustrating the thickness distribution of a polished film according to the first embodiment described herein.

According to a result obtained by measuring the thickness distribution of the wiring layer 2006 at the surface of the polished wafer 200, the height of the inter-wiring insulation film 2002 at a portion of the surface of the wafer 200 may not coincide with the height of the inter-wiring insulation film 2002 at another portion as illustrated in FIG. 3. For example, as illustrated in FIG. 6, the wiring layer 2006 may have a distribution A in which the thickness of the wiring layer 2006 at the peripheral portion of the wafer 200 is smaller than the thickness of the wiring layer 2006 at the center portion of the wafer 200 or a distribution B in which the thickness of the wiring layer 2006 at the center portion of the wafer 200 is smaller than the thickness of the wiring layer 2006 at the peripheral portion of the wafer 200.

When the wiring layer 2006 has a difference in thickness between the respective portions, a location at which a void can be formed to a desired depth and a location at which a void cannot be formed to a desired depth may occur at a void forming step 106. At this time, the void refers to a void used as an air gap afterwards. The problem such as a thickness difference of the film may decrease the yield of the semiconductor device.

The present inventor has worked hard to find out the reasons that the distributions A and B occur. Hereafter, the reason will be described.

The reason that the distribution A occurs depends on the method of supplying slurry to a wafer. As described above, slurry supplied onto the polishing cloth 402 is supplied toward to the center portion of the wafer 200 from the peripheral portion of the wafer 200 through the retainer ring 403b. Thus, while slurry having polished the peripheral portion of the wafer 200 is supplied to the center portion of the wafer 200, fresh slurry is introduced to the peripheral portion of the wafer 200. Since the fresh slurry has higher polishing efficiency, the peripheral portion of the wafer 200 is polished more than the center portion of the wafer 200. Due to such a reason, the thickness distribution of the wiring layer 2006 is considered to be formed as indicated by the distribution A.

The reason that the distribution B occurs depends on wear of the retainer ring 403b. When the polishing apparatus 400 polishes a large number of wafers, the front end of the retainer ring 403b pressed against the polishing cloth 402 is worn, and the contact surface between the retainer ring 403b and the trench 403d or the polishing cloth 402 is deformed. Therefore, slurry which is to be supplied may not be supplied into the inner periphery to the retainer ring 403b. When slurry is not supplied to the inner periphery of the retainer ring 403b, slurry is not supplied to the peripheral portion of the wafer 200. Thus, while the center portion of the wafer 200 is polished, the outer peripheral portion of the wafer 200 is not polished. Due to such a reason, the thickness distribution of the wiring layer 2006 is considered to be formed as indicated by the distribution B.

[Film Thickness Measuring Step S103]

At a film thickness measuring step S103, the thickness of the wiring layer 2006 is measured. The measuring is performed through a measuring apparatus such as an existing optical measuring apparatus. The film thickness measuring step S103 may include measuring the thickness of the inter-wiring insulation film 2002 through which light is transmitted. The thicknesses of at least two locations on the surface of the wafer 200 are measured. One location is the center portion of the wafer 200, and the other location is the peripheral portion of the wafer 200. In the first embodiment, the inter-wiring insulation film 2002 at the center portion of the wafer 200 is referred to as an inter-wiring insulation film 2002a, and the inter-wiring insulation film 2002 at the peripheral portion of the wafer 200 is referred to as an inter-wiring insulation film 2002b.

The measuring apparatus measures the thickness of the inter-wiring insulation film 2002 of the wafer 200 illustrated in FIG. 3. Specifically, the measuring apparatus measures the height Ha of the inter-wiring insulation film 2002a and the height Hb of the inter-wiring insulation film 2002b. "Height of inter-wiring insulation film" indicates a distance from the upper end of the first interlayer insulation film 2001 to the upper end of the inter-wiring insulation film 2002.

The measuring apparatus calculates a thickness distribution by measuring the thickness of the inter-wiring insulation film, and transmits the information to an upper apparatus.

[Diffusion Prevention Film Forming Step S104]

Figure 7:
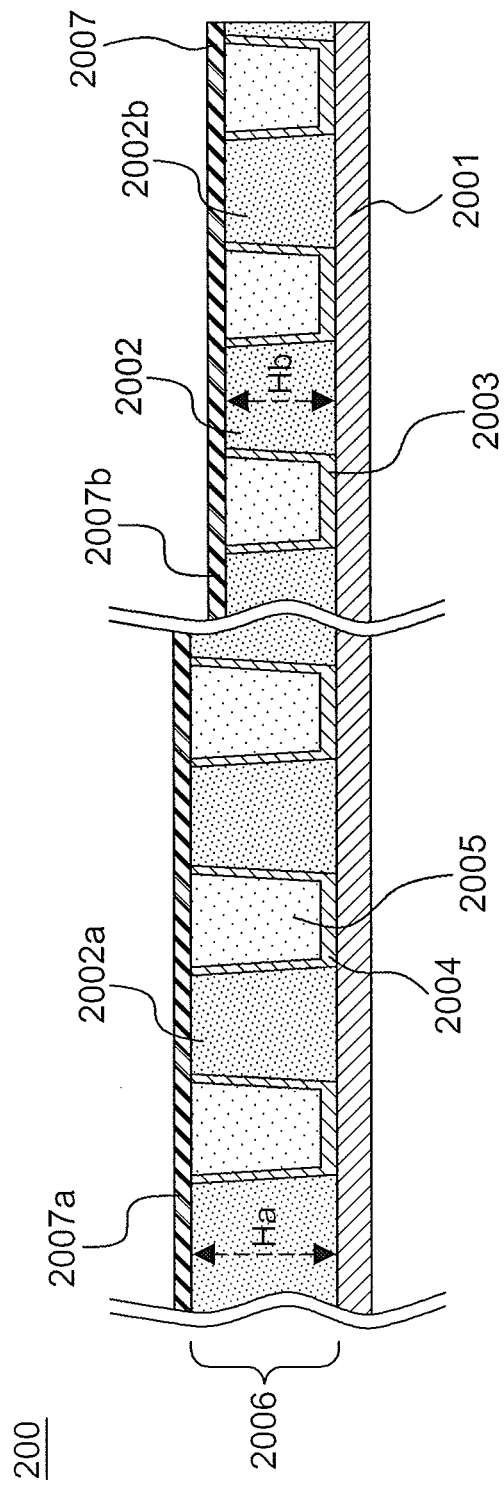
FIG. 7 is a diagram illustrating a processed state of the wafer according to the first embodiment described herein.

Next, referring to FIG. 7, a diffusion prevention film forming step S104 will be described. At the diffusion prevention film forming step S104, a diffusion prevention film 2007 is formed on the wafer 200 having the wiring layer 2006 formed therein. The diffusion prevention film 2007 is a silicon oxynitride film (SiON film), for example. The diffusion prevention film 2007 serves to increase an insulating property while suppressing diffusion. The property of the diffusion prevention film 2007 can prevent an element of the copper-containing film 2005 from diffusing to an upper layer. When a clearance between wirings is significantly small, adjacent wirings [copper-containing films 2005] may be electrically connected to each other through an upper layer formed on the wiring layer 2006, but the diffusion prevention film 2007 can suppress the electrical connection. In the first embodiment, the diffusion prevention film 2007 at the center portion of the wafer 200 is referred to as a diffusion prevention film 2007a, and the diffusion prevention film 2007 at the peripheral portion of the wafer 200 is referred to as a diffusion prevention film 2007b.

[Resist Coating and Lithographic Exposure Step S105]

Figure 8:
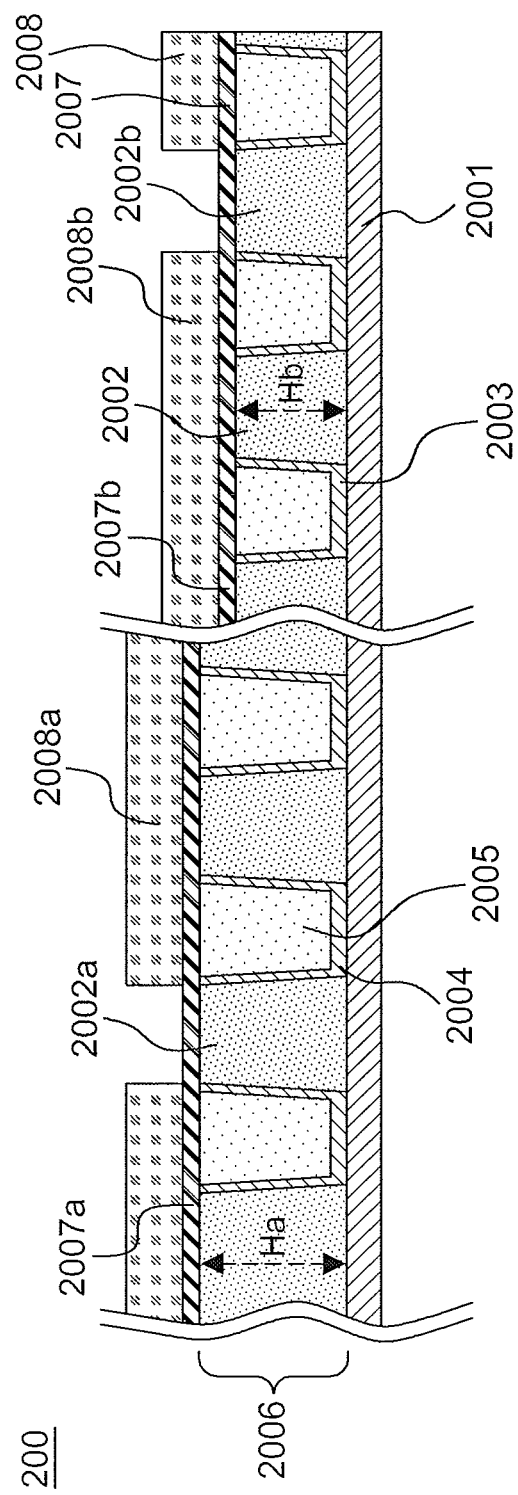
FIG. 8 is a diagram illustrating a processed state of the wafer according to the first embodiment described herein.

Next, a resist coating and lithographic exposure step S105 will be described. At the resist coating and lithographic exposure step S105, the wafer 200 formed on the diffusion prevention film 2007 illustrated in FIG. 7 is processed. First, a resist layer 2008 for patterning is formed on the diffusion prevention film 2007. Then, lithographic exposure is performed to pattern the resist layer 2008 as illustrated in FIG. 8. In the first embodiment, the resist layer 2008 at the center portion of the wafer 200 is referred to as a resist layer 2008a, and the resist layer 2008 at the peripheral portion of the wafer 200 is referred to as a resist layer 2008b.

[Void Forming Step S106]

Figure 9:
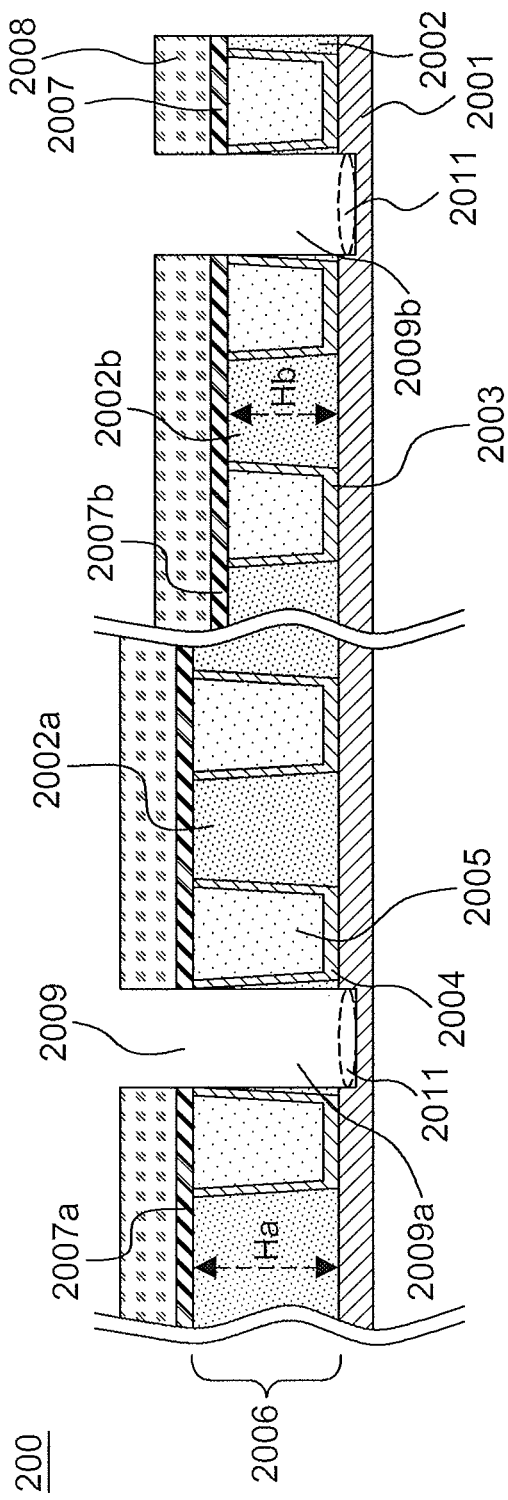
FIG. 9 is a diagram illustrating a processed state of the wafer according to the first embodiment described herein.

After the resist layer 2008 is patterned to a desired form through the resist coating and lithographic exposure step S105, a part of the inter-wiring insulation film 2002 is etched to form a void 2009 between the copper-containing films 2005 as illustrated in FIG. 9. For example, the void 2009 is formed between the adjacent copper-containing films 2005. The void 2009 is used as an air gap afterwards. In the first embodiment, the void 2009 at the center portion of the wafer 200 is referred to as a void 2009a, and the void 2009 at the peripheral portion of the wafer 200 is referred to as a void 2009b. After the void 2009 is formed, the resist layer 2008 is removed.

Hereafter, the void 2009 according to the first embodiment will be described in detail. Recently, with the miniaturization and high integration, the distance between wirings has been reduced. Thus, the capacitance between the wirings may increase to cause a signal delay. In order to solve such a problem, a clearance between the wirings can be filled with an insulating material having a low dielectric constant. However, although the clearance is filled with the insulating material, there is a physical limitation in overcoming the problem. Thus, the dielectric constant may be lowered by forming a void such as an air gap between the wirings.

Figure 10A:
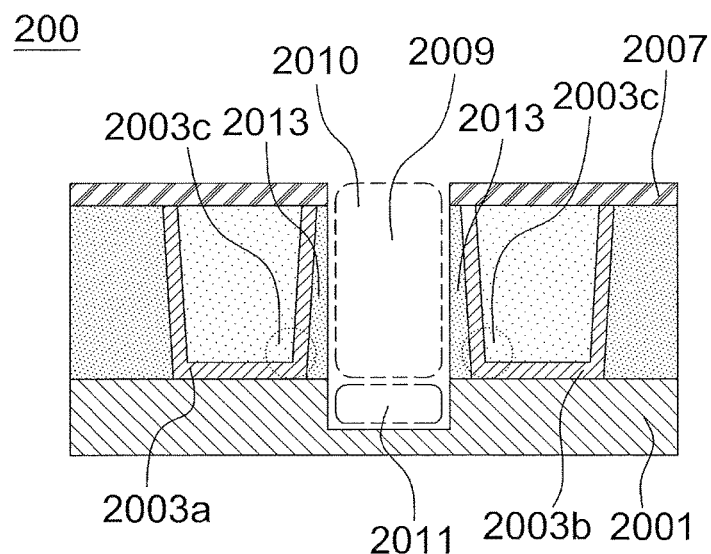
FIGS. 10A and 10B are diagrams illustrating a processed state of the wafer according to the first embodiment described herein and a processed state of a wafer according to a comparative example.
Figure 10B:
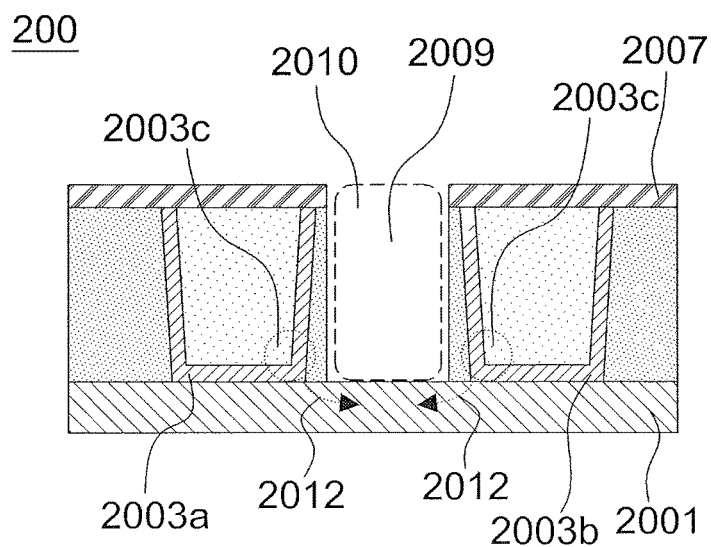

Even in the structure with an air gap, adjacent wirings may be electrically connected to each other. Such a problem will be described with reference to FIG. 10A illustrating the first embodiment and FIG. 10B illustrating a comparative example of the first embodiment. FIGS. 10A and 10B are expanded views of locations where a void is formed. In the following descriptions, one trench 2003 is referred to as a trench 2003a, and another trench 2003 adjacent to the trench 2003a is referred to as a trench 2003b. Furthermore, portions adjacent to the bottoms (lower ends) of the trenches 2003a and 2003b with the void 2009 interposed therebetween is referred to as trenches 2003c. The trench 2003c is a location indicated by a dotted circle in FIGS. 10A and 10B.

The void 2009 in FIGS. 10A and 10B includes a space 2010 formed between the trenches 2003. The void 2009 of FIG. 10A further includes a space 2011. The space 2011 is disposed under the bottom of the trench 2003. That is, the space 2011 is disposed at a lower position than the trench 2003c. The space 2011 is formed in the inter-wiring insulation film 2002, for example.

Even when the trench 2003 is filled with the copper-containing film 2005, electric fields are concentrated on the trench 2003c. Thus, in the structure of FIG. 10, a current may leak through the interlayer insulation film 2001 as indicated by a dotted arrow 2012. When the distance between the wirings is shortened, the adjacent wirings may be electrically connected by a leak current.

In order to solve such a problem, the space 2011 is formed as illustrated in FIG. 10A. Thus, the void disposed under the trench 2003c can suppress the problem that the adjacent wirings are electrically connected through a leak current as illustrated in FIG. 10B.

(Substrate Processing Apparatus)

Next, a substrate processing apparatus 100 used at the void forming step S106 will be described with reference to FIGS. 11 through 16. In the first embodiment, the substrate processing apparatus 100 is used as an etching apparatus for forming the void 2009. In the first embodiment, the substrate processing apparatus 100 is a single wafer-type substrate processing apparatus as illustrated in FIG. 11.

Figure 11:
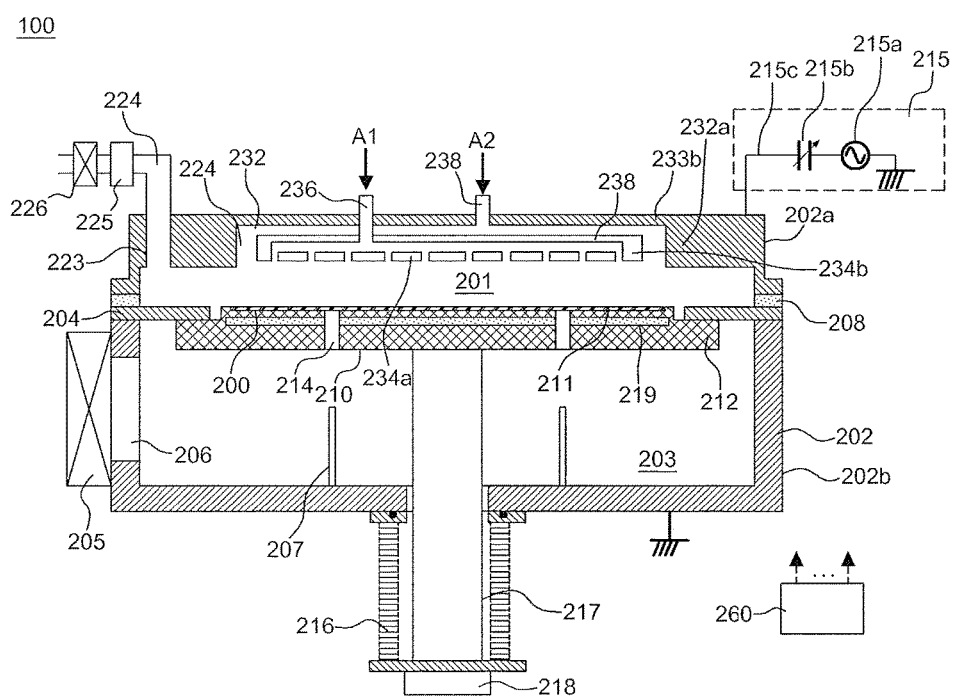
FIG. 11 is a diagram illustrating a substrate processing apparatus according to the first embodiment described herein.

As illustrated in FIG. 11, the substrate processing apparatus 100 includes a process container 202. The process container 202 has a circular cross-sectional surface, and is a flat airtight container. The process container 202 is formed of quartz or a metallic material such as aluminum (Al) or stainless steel (SUS). The process container 202 includes a transfer chamber 203 and a process chamber 201 where a wafer 200 such as a silicon substrate is processed. The process container 202 includes an upper container 202a and a lower container 202b. Between the upper container 202a and the lower container 202b, a partition plate 204 is installed. The space above the partition plate 204, surrounded by the upper container 202a, is referred to as a process space, and a chamber constituting the process space is referred to as the process chamber 201. The space under the partition plate 204, surrounded by the lower container 202b, is referred to as a transfer space, and a chamber constituting the transfer space is referred to as the transfer chamber 203. The partition plate 204 is formed of an insulator, and insulates the lower container 202b from a substrate placing table 212 described later.

Between the upper container 202a and the lower container 202b, a support portion 208 formed of an insulator is installed to support the upper container 202a. The support portion 208 electrically insulates the upper container 202a and the lower container 202b from each other.

The lower container 202b has a substrate loading/unloading port 206 formed at a side surface thereof, the substrate loading/unloading port 206 being adjacent to a gate valve 205. The wafer 200 is moved between a transfer module (not illustrated) and the transfer chamber 203 through the substrate loading/unloading port 206. The lower container 202b has a plurality of lift pins 207 installed at the bottom thereof.

The process chamber 201 has a substrate support 210 installed therein, the substrate support 210 supporting the wafer 200. The substrate support 210 includes a substrate placing table 212 having a substrate placing surface 211 on which the wafer 200 is placed. The substrate placing table 212 has a bias electrode 219 installed therein. The substrate placing table 212 has a plurality of through-holes 214 through which the respective lift pins 207 are passed, the plurality of through-holes 214 being disposed at positions corresponding to the respective lift pins 207.

The substrate placing table 212 is supported by a shaft 217. The shaft 217 is formed through the bottom portion of the process container 202, and connected to an elevating mechanism 218 outside the container 202. As the elevating mechanism 218 is operated to lift/lower the shaft 217 and the substrate placing table 212, the wafer 200 placed on the substrate placing surface 211 can be lifted/lowered. The outer periphery of the lower portion of the shaft 217 is covered by a bellows 216. The inside of the process chamber 201 is airtightly maintained.

When the wafer 200 is transferred, the substrate placing table 212 is lowered to a position (wafer transfer position) facing the substrate loading/unloading port 206. When the wafer 200 is processed as illustrated in FIG. 11, the substrate placing table 212 is lifted until the substrate placing table 212 reaches a position (wafer process position) within the process chamber 201 where the wafer 200 is processed.

Specifically, when the substrate placing table 212 is lowered to the wafer transfer position, the upper ends of the lift pins 207 protrude from the substrate placing surface 211, and the lift pins 207 support the wafer 200 from thereunder. When the substrate placing table 212 is lifted to the wafer process position, the lift pins 207 are buried from the substrate placing surface 211, and the substrate placing surface 211 supports the wafer 200 from thereunder. Since the lift pins 207 are in direct contact with the wafer 200, the lift pins 207 may be formed of a material such as quartz or alumina. An elevating mechanism may be installed at the lift pins 207, such that the substrate placing table 212 and the lift pins 207 are relatively moved.

Figure 12:
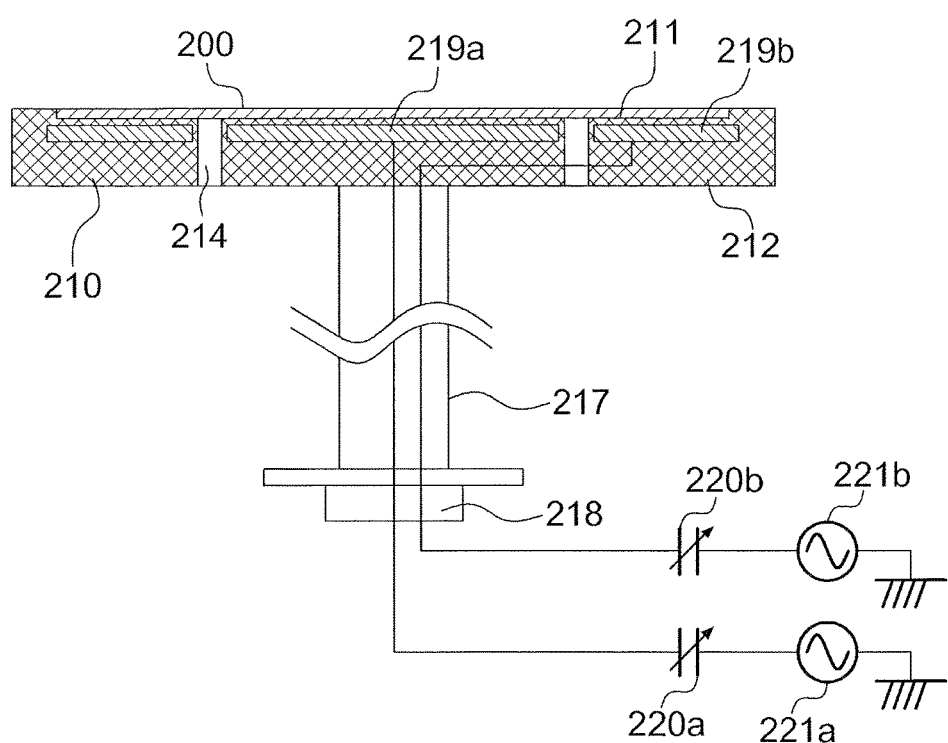
FIG. 12 is a diagram illustrating the substrate processing apparatus according to the first embodiment described herein.
Figure 13:
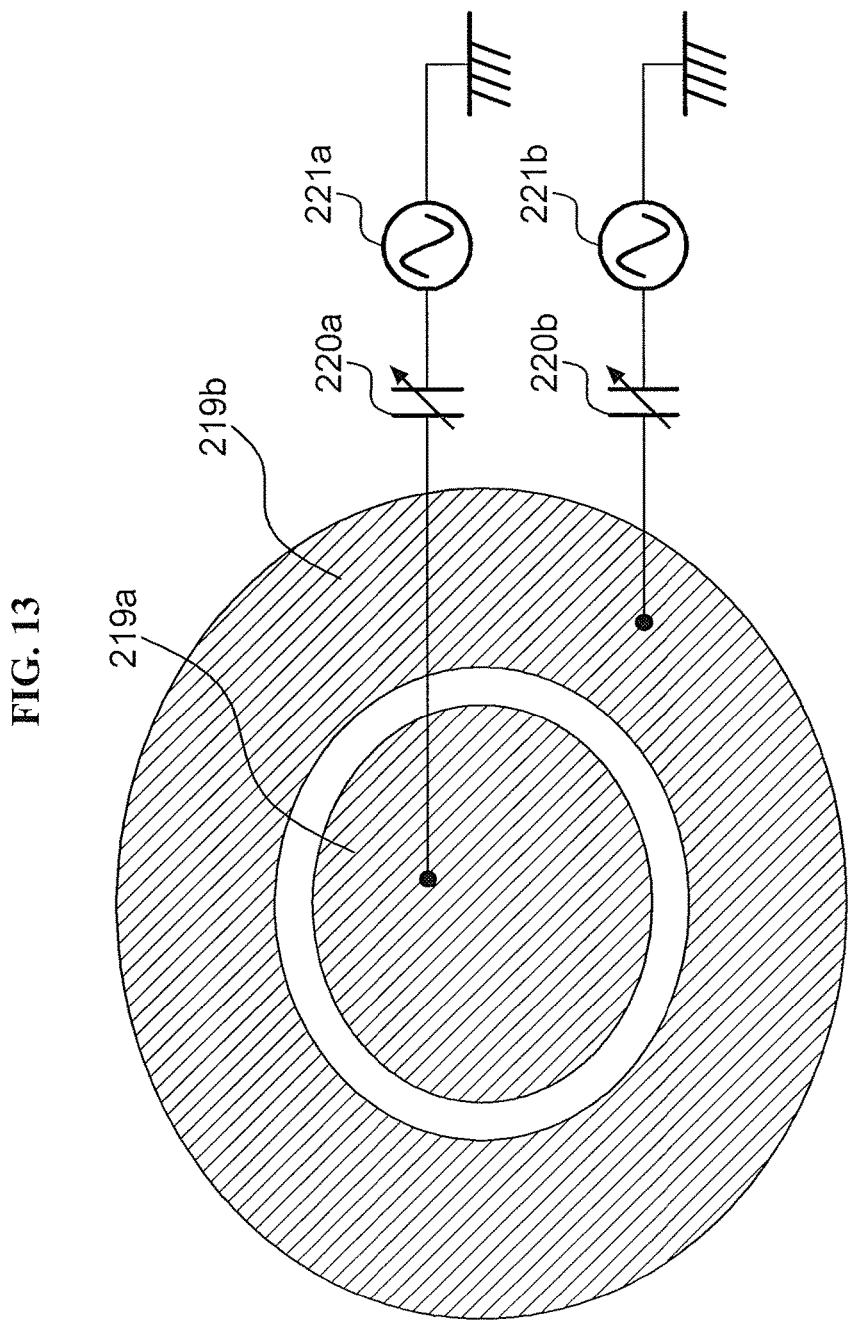
FIG. 13 is a diagram illustrating the substrate processing apparatus according to the first embodiment described herein.

The bias electrode 219 will be described with reference to FIGS. 12 and 13. The substrate placing table 212 includes first and second bias electrodes 219a and 219b constituting the bias electrode 219. The first bias electrode 219a is connected to an impedance matching unit 220a, and the second bias electrode 219b is connected to an impedance matching unit 220b. The first and second bias electrodes 219a and 219b are grounded. As illustrated in FIG. 13, the first and second bias electrodes 219a and 219b may be concentrically arranged to adjust the electric potentials of the center portion and the peripheral portion of the substrate, respectively.

High-frequency power supplies 221a and 221b may be installed at the respective impedance matching units 220a and 220b. The installation of the high-frequency power supply 221a can widen the adjustment range of the electric potential of the first bias electrode 219a, and widen the adjustment range of the amount of active species drawn toward the center portion of the wafer 200. Furthermore, the installation of the high-frequency power supply 221b can widen the adjustment range of the electric potential of the second bias electrode 219b, and widen the adjustment range of the amount of active species drawn toward the peripheral portion of the wafer 200. For example, when the active species have a positive potential, the electric potential of the first bias electrode 219a may be adjusted to a negative potential, such that the electric potential of the second bias electrode 219b is higher than the electric potential of the first bias electrode 219a. Then, a larger amount of active species may be supplied to the center portion of the wafer 200 than the peripheral portion of the wafer 200. Even when the electric potential of active species generated in the process chamber 201 is close to the neutral potential, the amount of active species drawn toward the wafer 200 can be adjusted through any one or both of the high-frequency power supplies 221a and 221b.

In the first embodiment, the bias electrode 219, the impedance matching unit 220a and the impedance matching unit 220b are collectively referred to as a bias adjusting unit. The bias adjusting unit may further include the high-frequency power supply 221a and the high-frequency power supply 221b.

(Exhaust System)

The process chamber 201 [upper container 202a] includes an exhaust port 223 for exhausting the atmosphere of the process chamber 201, the exhaust port 223 being installed at the upper portion of the inner wall of the process chamber 201. The exhaust port 223 is connected to an exhaust pipe 224. A pressure controller 225 and a vacuum pump 226 are sequentially connected in series to the exhaust pipe 224, the pressure controller 225 including an APC (Automatic Pressure Controller) for controlling the process chamber 201 to a predetermined pressure. The exhaust system (exhaust line) is constituted by the exhaust port 223, the exhaust pipe 224 and the pressure controller 225. The exhaust system (exhaust line) may further include the vacuum pump 226.

(Buffer Chamber)

A buffer chamber 232 is installed above the process chamber 201. The buffer chamber 232 is constituted by a sidewall 232a and a ceiling 232b. The buffer chamber 232 has a shower head 234 installed therein. Between the inner wall 232a of the buffer chamber 232 and the shower head 234, a gas supply path 235 is disposed. That is, the gas supply path 235 is disposed to surround the outer wall 234b of the shower head 234.

Figure 14:
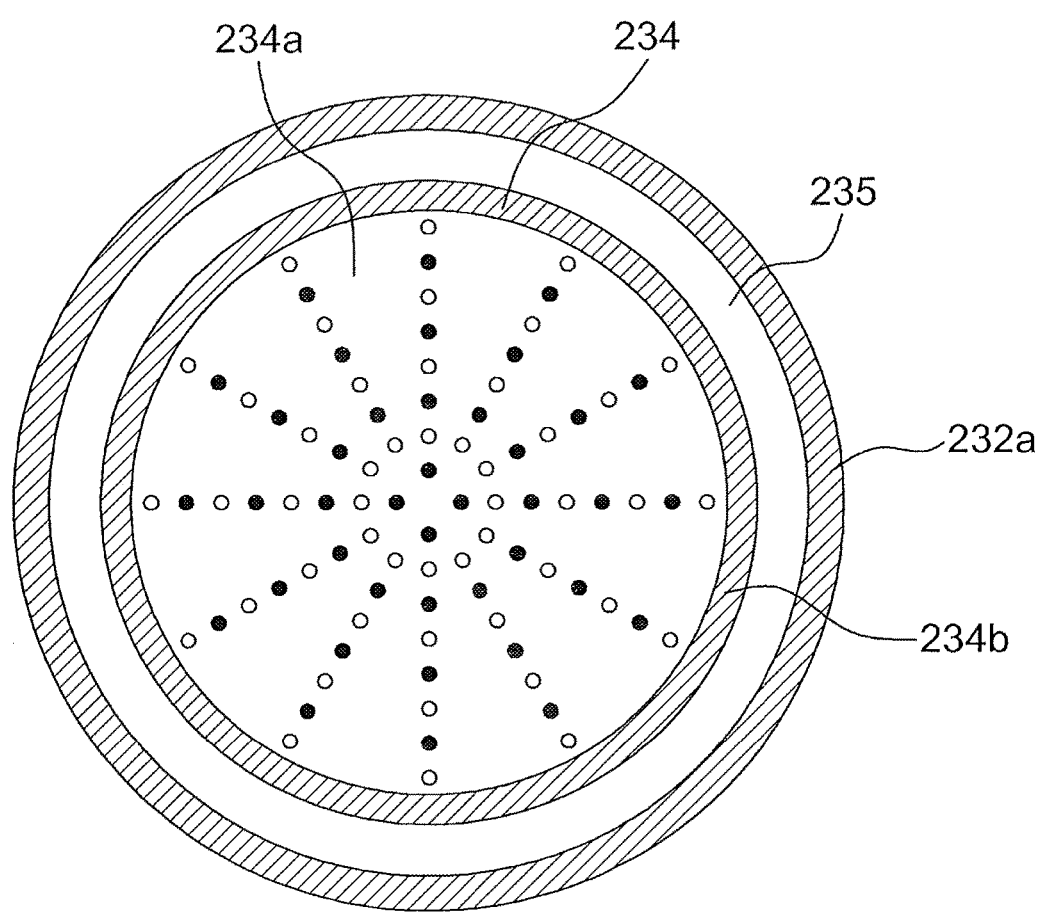
FIG. 14 is a diagram illustrating the substrate processing apparatus according to the first embodiment described herein.

A dispersion plate 234a is installed at a wall which divides the shower head 234 and the process chamber 201. The dispersion plate 234a is disk-shaped, for example. When seen from the process chamber 201, the gas supply path 235 is disposed between the sidewall 234b of the shower head 234 around the dispersion plate 234a as illustrated in FIG. 14.

The ceiling 232b of the buffer chamber 232 is connected to a gas introduction pipe 236 and a gas introduction pipe 238. The gas introduction pipe 236 is connected to the shower head 234. The gas introduction pipes 236 and 238 are connected to a gas supply system described later.

A gas introduced through the gas introduction pipe 236 is supplied to the process chamber 201 through the shower head 234. An etching gas introduced through the gas introduction pipe 238 is supplied to the process chamber 201 through the gas supply path 235.

The gas supplied through the shower head 234 is supplied onto the center portion of the wafer 200. The gas supplied through the gas supply path 235 is supplied onto the peripheral portion of the wafer 200. The peripheral portion (edge) of the wafer 200 refers to the outer portion than the center portion of the wafer. The shower head 234 is formed of a material such as quartz, alumina, stainless steel and aluminum.

(Gas Supply System)

Figure 15:
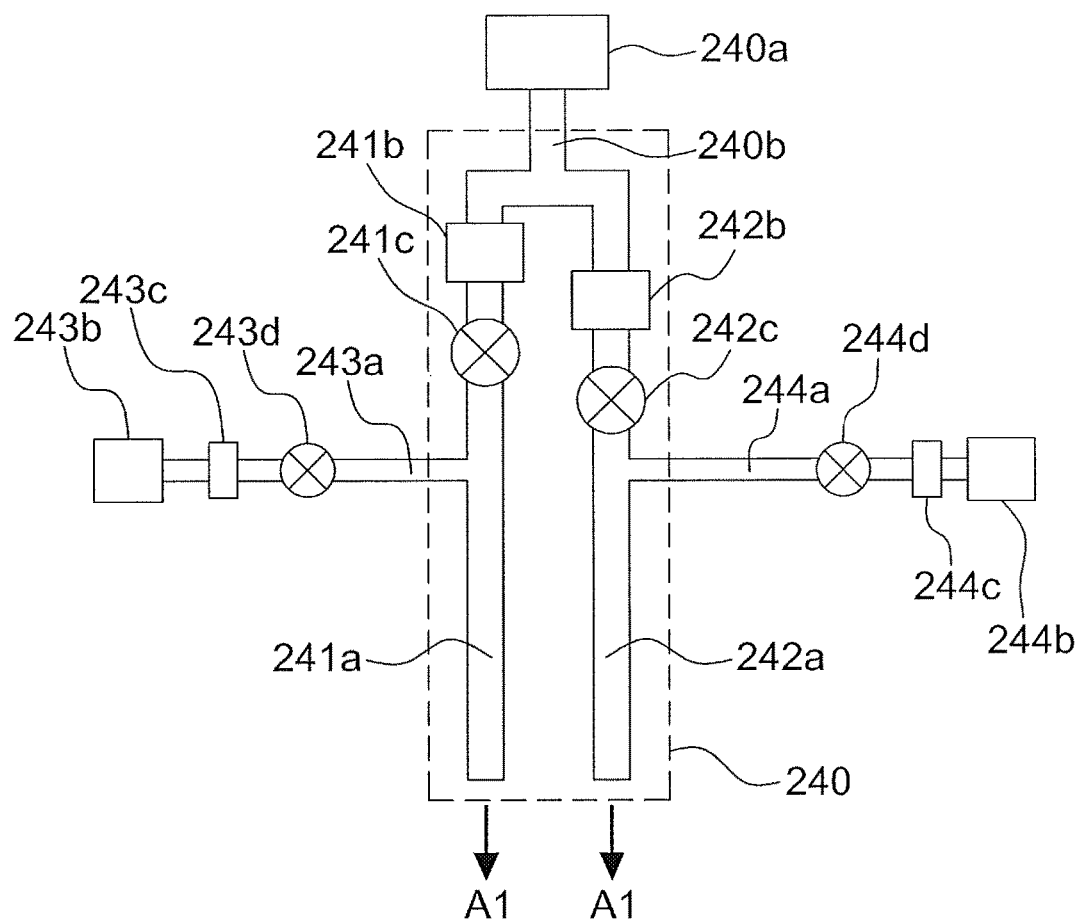
FIG. 15 is a diagram illustrating the substrate processing apparatus according to the first embodiment described herein.

Next, referring to FIG. 15, the gas supply system will be described. In FIG. 15, a portion denoted by symbol A1 is connected to a portion denoted by symbol A1 in FIG. 11, and a portion denoted by symbol A2 is connected to a portion denoted by symbol A2 of FIG. 11. That is, a gas supply pipe 241a is connected to the gas introduction pipe 236, and a gas supply pipe 242a is connected to the gas introduction pipe 238.

From the upstream side toward the downstream side of the gas supply pipe 241a, a junction pipe 240b, a MFC (Mass Flow Controller) 241b and a valve 241c are sequentially installed at the gas supply pipe 241a. The flow rate of gas passed through the gas supply pipe 241a is controlled by the MFC 241b and the valve 241c. A fluorine-based etching gas source 240a capable of etching a silicon-containing film is installed at the upstream end of the junction pipe 240b. The etching gas may include a fluorine-based gas such as carbon tetrafluoride ($CF_4$) and hexafluoroethane ($C_2F_6$).

Desirably, a first inert gas supply pipe 243a is connected to the gas supply pipe 241 in order to supply an inert gas to the downward side of the valve 241c. From the upstream side toward the downstream side of the inert gas supply pipe 243a, an inert gas source 243b, an MFC 243c and a valve 243d are sequentially installed at the inert gas supply pipe 243a. The inert gas may include nitrogen ($N_2$) gas, for example. The inert gas is added to a gas flowing through the gas supply pipe 241a, and used as a dilution gas. The MFC 243c and the valve 243d can be controlled to optimally adjust (tune) the concentration or flow rate of etching gas supplied through the gas introduction pipe 236 and the shower head 234.

From the upstream side toward the downstream side of the gas supply pipe 242a connected to the gas introduction pipe 238, the junction pipe 240b, an MFC 242b and a valve 242c are sequentially installed at the gas supply pipe 242a. The flow rate of gas passed through the gas supply pipe 242a is controlled by the MFC 242b and the valve 242c. The etching gas source 240a is installed at the upstream side of the junction pipe 240b.

Desirably, a second inert gas supply pipe 244a is connected to the gas supply pipe 242a in order to supply an inert gas to the downstream side of the valve 242c. From the upstream side toward the downstream side of the inert gas supply pipe 244a, an inert gas source 244b, an MFC 244c and a valve 244d are sequentially installed at the inert gas supply pipe 244a. The inert gas may include helium (He) gas, for example. The inert gas is added to a gas flowing through the gas supply pipe 242a, and used as a dilution gas. The MFC 244c and the valve 244d can be controlled to optimally adjust (tune) the concentration or flow rate of gas supplied through the gas introduction pipe 238 and the gas supply path 235.

The gas supply pipe 241a, the MFC 241b, the valve 241c, the gas supply pipe 242a, the MFC 242b, the valve 242c and the junction pipe 240b are collectively referred to as an etching gas supply unit. The etching gas supply unit may further include the gas source 240a, the gas introduction pipe 236 and the gas introduction pipe 238.

The first inert gas supply pipe 243a, the MFC 243c, the valve 243d, the second inert gas supply pipe 244a, the MFC 244c and the valve 244d are collectively referred to as an inert gas supply unit. The inert gas supply unit may further include the inert gas source 243b and the inert gas source 244b. The etching gas supply unit may further the inert gas supply unit.

(Plasma Generation Unit)

The upper container 202a is connected to a plasma generation unit 215. The plasma generation unit 215 includes at least a power supply 215a, an impedance matching unit 215b and a wiring 215c for connecting the power supply 215a and the impedance matching unit 215b to the upper container 202a. The plasma generation unit 215 is connected to a controller 260 described later.

When the power supply 215a of the plasma generation unit 215 is turned on, an etching gas supplied to the process chamber 201 is changed to a plasma state. The on/off switching of the power supply 215a is controlled according to an instruction of the controller 260.

(Controller)

The substrate processing apparatus 100 includes the controller 260 for controlling the operations of the respective components of the substrate processing apparatus 100.

Figure 16:
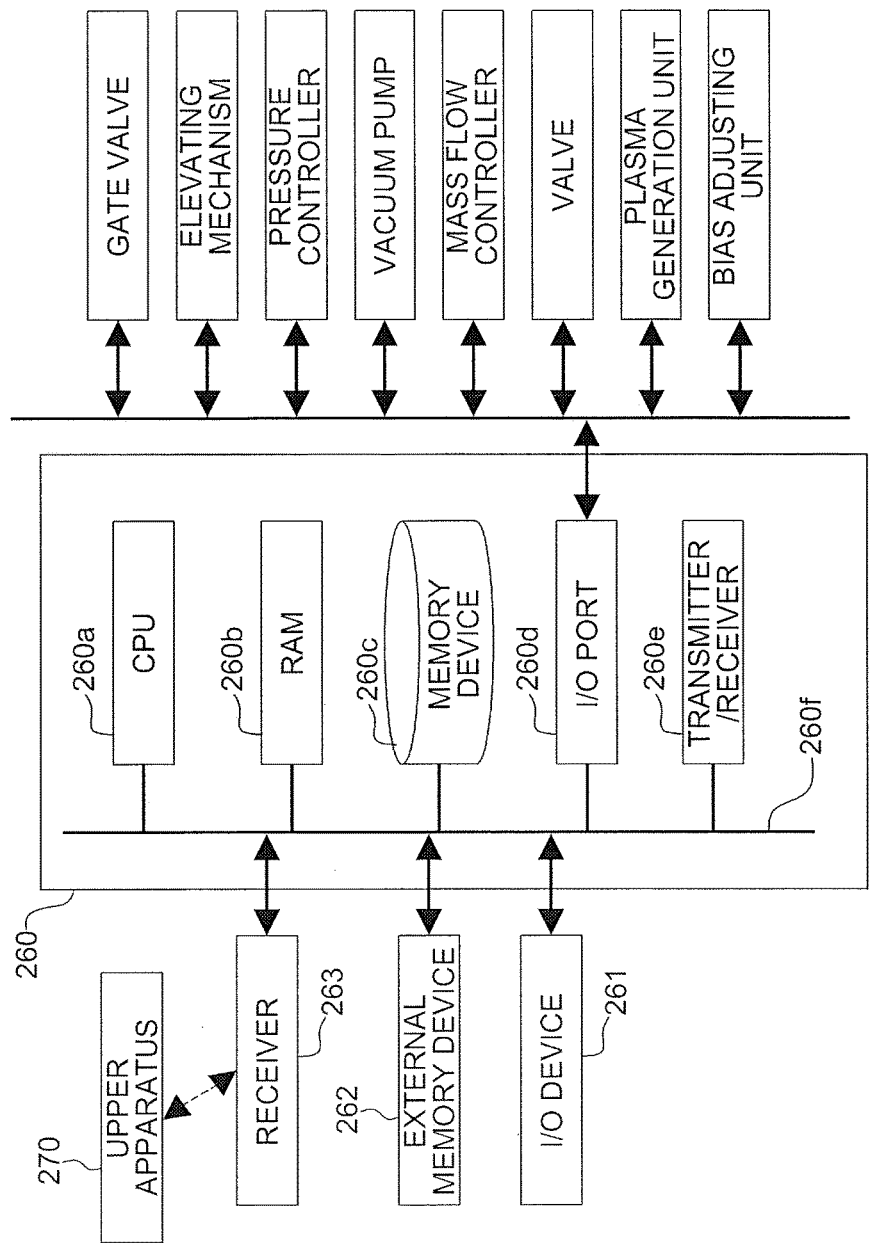
FIG. 16 is a diagram illustrating the substrate processing apparatus according to the first embodiment described herein.

FIG. 16 schematically illustrates the controller 260. The controller 260 serving as a control unit is embodied by a computer including a CPU (Central Processing Unit) 260a, a RAM (Random Access Memory) 260b, a memory device 260c serving as a memory unit, and an I/O port 260d. The RAM 260b, the memory device 260c and the I/O port 260d may exchange data with the CPU 260a through an internal bus 260f. Data transmission or reception in the substrate processing apparatus 100 is performed by a transmitter/receiver 260e.

The controller 260 may be connected to an external memory device 262 or an I/O device 261 such as a touch panel. A receiver 263 is connected to an upper apparatus 270 through a network. The receiver 263 may receive information of another device from the upper apparatus 270.

The memory device 260c is embodied by a flash memory or HDD (Hard Disk Drive), for example. The memory device 260c readably stores a control program for controlling the operation of the substrate processing apparatus or a process recipe containing the sequence or condition of a substrate processing process described later. For example, the thickness distribution of the wiring layer 200b and data correlated to control of the gas supply unit or the plasma generation unit 215 are stored in the memory device 260c. The process recipe includes steps of the substrate processing process described later, which are combined to acquire a predetermined result through the controller 260, and functions as a program. Hereafter, the program recipe or control program is simply referred to as a program. In this specification, the term 'program' may indicate only a program recipe, indicate only a control program, or indicate both of the program recipe and the control program. The RAM 260b functions as a work area in which a program or data read by the CPU 260a is temporarily stored.

The I/O port 260d is connected to the components of the substrate processing apparatus 100, such as the gate valve 205, the elevating mechanism 218, the bias electrode 219, the pressure controller 225 and the vacuum pump 226.

The CPU 260a reads a control program from the memory device 260c and executes the control program. Furthermore, the CPU 260a reads a process recipe from the memory device 260c in response to an input of operation command from the I/O device 261. The CPU 260a may control an opening/closing operation of the gate valve 205, a lifting/lowering operation of the elevating mechanism 218, a power supply operation to the bias electrode 219, a pressure control operation of the pressure controller 225, an on/off control operation for the vacuum pump 226, a flow rate adjusting operation of an MFC and an opening/closing operation of the valve, according to the contents of the read process recipe.

The controller 260 is not limited to a dedicated computer, but may be embodied by a universal computer. For example, the external memory device 262 storing the above-described program may be prepared, and a program may be installed in a universal computer through the external memory device 262, in order to embody the controller 260 according to the first embodiment. The external memory device 262 may include magnetic disks such as a magnetic tape, flexible disk and hard disk, optical disks such as CD and DVD, a magneto-optical disk such as MO, and semiconductor memories such as a USB flash drive and memory card. The unit for supplying a program to the computer is not limited to the external memory device 262. For example, the program may be supplied through a communication unit such as the Internet and a dedicated line, without the external memory device 262. The memory device 260c and the external memory device 262 may be embodied by transitory computer readable recording media. Hereafter, they are collectively referred to as recording media. In this specification, the term 'recording medium' may indicate only the memory device 260c, indicate only the external memory device 262, or indicate both of the memory device 260c and the external memory device 262.

(Substrate Processing Method)

Figure 17:
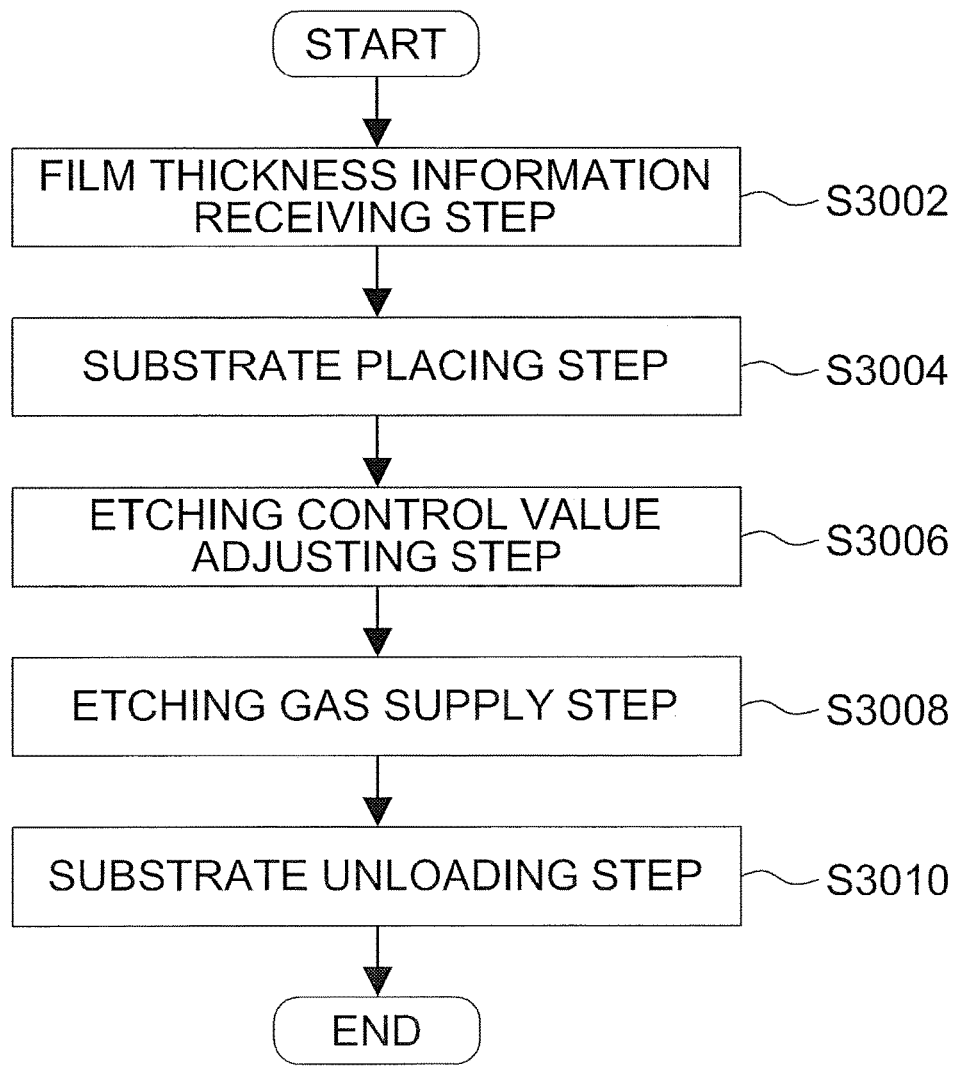
FIG. 17 is a diagram illustrating a substrate processing flow according to the first embodiment described herein.

Next, referring to FIG. 17, a void forming method using the substrate processing apparatus 100 will be described. FIG. 17 is a flowchart illustrating the void forming step S106 of FIG. 1 in detail. The void forming method is one of substrate processing methods. In the following descriptions, the respective units constituting the substrate processing apparatus are controlled by the controller 260.

[Film Thickness Information Receiving Step S3002]

The receiver 263 receives the thickness information measured through the film thickness measuring step S103 from the upper apparatus 270. The received information is the thickness information of the inter-wiring insulation film 2002. The thickness information of the inter-wiring insulation film 2002 is also referred to as film thickness information. Specifically, the thickness information of the inter-wiring insulation film 2002 is the thickness information of the inter-wiring insulation film 2002a or the inter-wiring insulation film 2002b. In the first embodiment, the thickness information of the inter-wiring insulation film 2002a and the inter-wiring insulation film 2002b is also referred to as thickness distribution information or film thickness distribution information. The received information is temporarily stored in the RAM 260b.

[Substrate Loading Step S2004]

After the resist coating and lithographic exposure step S105 is performed, the wafer 200 is loaded into the substrate processing apparatus 100. At this time, as the substrate support 210 is lowered by the elevating mechanism 218, the lift pins 207 protrude from the surface of the substrate support 210 from the through-holes 214. After the inner pressure of the process chamber 201 is controlled to a predetermined pressure, the gate valve 205 is opened, and the wafer 200 is placed on the lift pins 207 through the gate valve 205. After the wafer 200 is placed on the lift pins 207, the substrate support 210 is lifted to a predetermined position by the elevating mechanism 218, such that the wafer 200 is placed onto the substrate support 210 from the lift pins 207.

[Etching Control Value Adjusting Step S3006]

The CPU 260a reads the film thickness information stored in the RAM 260b and an etching control value database stored in the memory device 260c. The etching control value includes control data on the components such as the MFC, the valve and the plasma generation unit or data on operation times thereof.

Then, the CPU 260a compares the film thickness information to the etching control value database, and extracts an etching control value according to the thickness film information. The CPU 260a controls the respective components to perform substrate processing according to the extracted etching control value.

Next, the summary of a process based on the extracted etching control value will be described. The details thereof will be described later. First, the inside of the process chamber 201 is exhausted through the exhaust pipe 224 such that the inner pressure of the process chamber 201 becomes a predetermined degree of vacuum. At this time, the opening degree of the APC valve serving as the pressure controller 225 is feedback-controlled such that the inner pressure of the process chamber 201 becomes a pressure value contained in the extracted etching control value.

After the wafer 200 is placed on the substrate support 210 and the inner atmosphere of the process chamber 201 is stabilized, the MFC 241b, the MFC 242b and the plasma generation unit 215 are activated to adjust the opening degrees of the valves 241c and 242c. At this time, the opening degrees of the valves 252d and 244d may be adjusted as the same time as the MFCs 243c and 244c are activated.

[Etching Gas Supply Step S3008]

At an etching gas supply step S3008, a gas is supplied to the process chamber 201 through the gas supply system.

At the etching gas supply step S3008, the MFCs or valves adjusted through the etching control value adjusting step S3006 are controlled to adjust the amount (or concentration) of gas supplied onto the center portion of the wafer 200 and the amount (or concentration) of gas supplied onto the peripheral portion of the wafer 200.

The supplied etching gas is changed into plasma state by the plasma generation unit 215. The etching gas in plasma state is supplied into the process chamber 201, and forms a void 2009 through a reaction with the wafer 200.

When the etching gas is supplied, the bias of the substrate support 210 may be adjusted by the bias adjusting unit. When the bias is adjusted, the bias adjusting unit adjusts the electric potentials of the first and second bias electrodes 219a and 219b by controlling the high-frequency power supplies 221a and 221b according to the thickness information of the inter-wiring insulation film 2002 received from the upper apparatus 270.

By adjusting the amount of ion components in the etching gas reaching the center portion or the peripheral portion of the wafer 200, the amount of the center portion or the peripheral portion of the wafer 200 being etched may be adjusted.

When the high-frequency power supply is used, anisotropic etching can be performed more reliably. Thus, while the thickness of the wall 2013 between the void 2009 and the trench 2003 is secured, the void 2009 may be formed, thereby making it possible to maintain the strength with respect to the lateral direction in the structure of the semiconductor device after the void 2009 is formed. When the high-frequency power supply is not used, the wall 2013 may be etched because the introduction of ions weakens. In this case, the lateral strength of the wiring may be reduced.

After a predetermined time has elapsed, the respective valves are closed to stop the supply of gas.

[Substrate Unloading Step S3010]

As the substrate support 210 is lowered by the elevating mechanism 218 after the etching gas supply step S3008, the lift pins 207 protrude from the surface of the substrate support 210 from the through-holes 214. After the inner pressure of the process chamber 201 is controlled to a predetermined pressure, the gate valve 205 is opened, and the wafer 200 is unloaded from the lift pins 207 through the gate valve 205 to the outside of the transfer chamber 203.

Next, the etching control value adjusting step S3006 according to the first embodiment will be described in detail. After the polishing step S102 is ended, the thicknesses of the inter-wiring insulation film 2002 at the center portion and the peripheral portion of the wafer 200 are different from each other. At the film thickness measuring step S103, the thickness distribution of the film is measured. The measurement result is stored in the RAM 260b through the upper apparatus 270. The stored data are compared to the recipe stored in the memory device 260c, and control is performed based on the recipe.

Next, the case in which the data stored in the RAM 260b follows the distribution A will be described. As illustrated in FIGS. 6 and 7, the distribution A indicates that the thickness Ha of the inter-wiring insulation film 2002a is greater than the thickness Hb of the inter-wiring insulation film 2002b.

In the case of the distribution A, the etching control value is adjusted through the etching control value adjusting step S3006, such that the amount of the center portion of the wafer 200 being etched is smaller than the amount of the peripheral portion of the wafer 200 being etched. For example, the amount of supplied etching gas ranges from 10 sccm to 100 sccm. The etching time duration is set according to the center portion of the wafer 200, which has a relatively large thickness. In the first embodiment, an etching process is performed during a time duration corresponding to such an extent that at least the space 2011 can be formed. Furthermore, the maximum etching time duration may be set to such an extent that the inter-wiring insulation film 2002 is not penetrated. For example, the etching time duration ranges from 30 seconds to 120 seconds.

The reason why the etching time duration is set according to the thick portion will be described as follows. If the etching time duration is set according to the thin portion (the peripheral portion of the wafer 200 in the distribution A or the center portion of the wafer 200 in the distribution B), the amount of the thick portion being etched (the center portion of the wafer 200 in the distribution A or the peripheral portion of the wafer 200 in the distribution B) is not sufficient. Thus, the space 2011 may not be formed. In this case, the wirings may be electrically connected to each other.

Thus, by setting the etching time duration based on the thick portion in the first embodiment, the space 2011 may be reliably formed at the center portion and the peripheral portion of the wafer 200.

Next, a specific method for controlling the amount of the wafer 200 being etched will be described. In this method, the amount of the center portion of the wafer 200 being etched is controlled to a larger amount than the amount of the peripheral portion of the wafer 200 being etched. At this time, the amount or the like of etching gas supplied to the peripheral portion of the wafer 200 is controlled to a smaller value than the amount or the like of etching gas supplied to the center portion of the wafer 200.

At this time, by controlling the opening degree of the valve 241c while controlling the MFC 241b of the gas supply system, the amount of etching gas supplied into the process chamber 201 through the shower head 234 is controlled. Furthermore, by controlling the opening degree of the valve 242c while controlling the MFC 242b, the etching gas is supplied into the process chamber 201 through the gas supply path 235. The amount of supplied etching gas is controlled such that the amount of exposure per unit area of the surface of the wafer 200 to the gas supplied through the gas supply path 235 is smaller than the amount of exposure per unit area of the surface of the wafer 200 to the gas supplied through the shower head.

The etching gas supplied through the shower head 234 is supplied onto the inter-wiring insulation film 2002a formed at the center portion of the wafer 200. As illustrated in FIG. 9, the supplied etching gas forms the trench 2009a while etching the inter-wiring insulation film 2002a.

The etching gas supplied through the gas supply path 235 is supplied onto the inter-wiring insulation film 2002b formed at the peripheral portion of the wafer 200. As illustrated in FIG. 9, the supplied etching gas forms the trench 2000a while etching the inter-wiring insulation film 2002b.

For the amount of exposure per unit area of the surface of the wafer 200 to the etching gas, the amount of exposure around the inter-wiring insulation film 2002a to the etching gas is larger than the amount of exposure around the inter-wiring insulation film 2002b to the etching gas. Therefore, the amount of the inter-wiring insulation film 2002a being etched can be controlled to a larger amount than the amount of the inter-wiring insulation film 2002b being etched.

As illustrated in FIGS. 9 and 10A, the etching time duration is adjusted to form a space in each of the trenches 2009a and 2009b. Thus, the space 2011 may be formed in the trench 2009 of the wafer 200, which makes it possible to provide a high-quality semiconductor device in which a leak current is suppressed.

When the supply of the etching gas is controlled, the respective electric potentials of the first and second bias electrodes 219a and 219b may be adjusted. For example, the high-frequency power supplies 221a and 221b are adjusted such that the electric potential of the first bias electrode 219a is lower than the electric potential of the second bias electrode 219b. When the electric potential of the first bias electrode 219a is lower than the electric potential of the second bias electrode 219b, the amount of ions supplied to the center portion of the wafer 200 becomes greater than the amount of ions supplied to the peripheral portion of the wafer 200. Then, the amount of the center portion of the wafer 200 being etched can be controlled to a larger amount than the amount of the peripheral portion of the wafer 200 being etched.

Therefore, the amount of exposure per unit area of the surface of the wafer 200 to the etching gas can be controlled such that the amount of etching gas supplied through the shower head 234 becomes greater than the amount of etching gas supplied through the gas supply path 235.

As for another method, the concentrations of the etching gases supplied to the gas supply pipes 241a and 242a may be controlled in a state where the amounts of etching gases supplied to the gas supply pipes 241a and 242a are adjusted to the same amount. When the concentrations of the etching gases is controlled, the concentrations of etching gases passing through the gas supply pipes 241a and 242a are controlled by controlling the inert gas supply system. In the case of the distribution A, the amount of inert gas supplied through the gas supply pipe 243a is adjusted to a smaller amount than the amount of inert gas supplied through the gas supply pipe 244a, such that the concentration of the etching gas passing through the gas supply pipe 241a is higher than the concentration of the etching gas passing through the gas supply pipe 242a.

More desirably, the concentrations may be controlled to different values while the amounts of etching gases supplied to the gas supply pipes 241a and 242a are adjusted to different amounts. Such a control can supply the etching gases such that the amount of exposure per unit area of the center portion of the wafer 200 to the etching gas has a larger difference from the amount of exposure per unit area of the peripheral portion of the wafer 200 to the etching gas.

Figure 18:
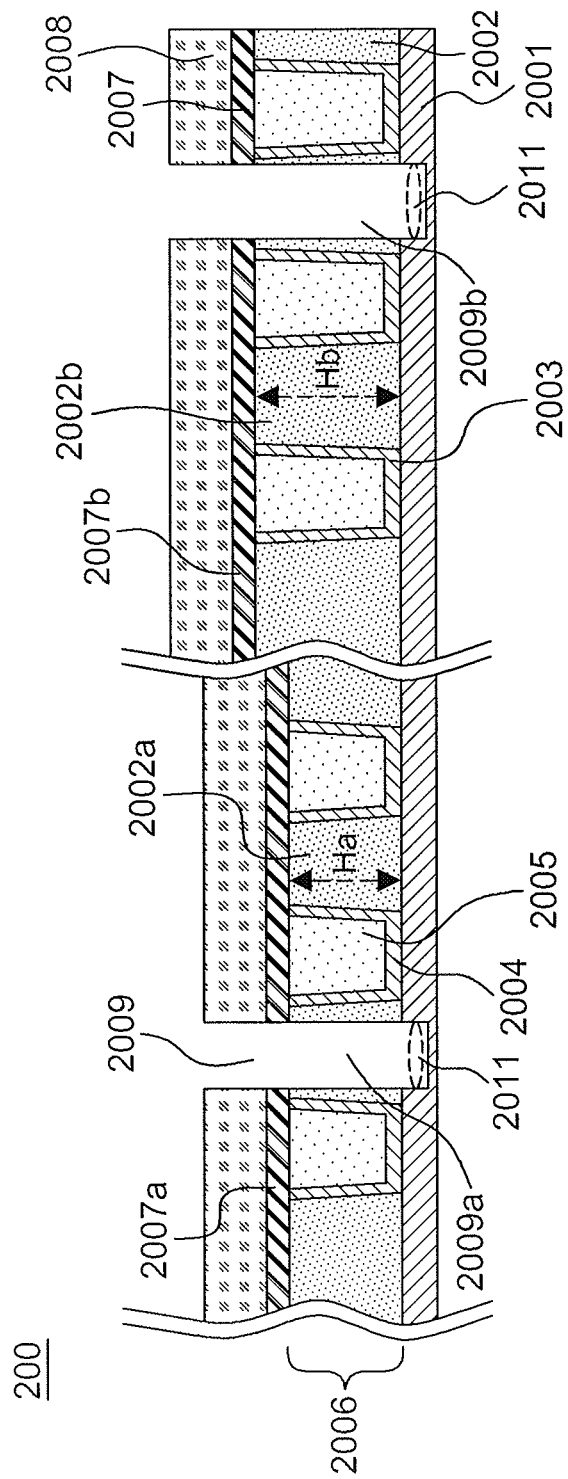
FIG. 18 is a diagram illustrating a processed state of the wafer according to the first embodiment described herein.

Next, the case in which the data stored in the RAM 260b follows the distribution B will be described. As illustrated in FIG. 18, the distribution B indicates that the thickness Hb of the inter-wiring insulation film 2002b is greater than the thickness Ha of the inter-wiring insulation film 2002a.

In the case of the distribution B, the etching control value is adjusted through the etching control value adjusting step S3006 such that the amount of the center portion of the wafer 200 being etched is greater than the amount of the peripheral portion of the wafer 200 being etched. For example, the amount of supplied etching gas ranges from 10 sccm to 100 scm. The etching time duration is set according to the etching time duration of the thick portion, that is, the peripheral portion of the wafer 200. In the first embodiment, the etching process is performed during a time duration corresponding to such an extent that at least the space 2011 can be formed. Alternatively, even the maximum etching time duration is set to such an extent that the interlayer insulation film 2001 is not penetrated. For example, the etching time duration ranges from 30 to 120 seconds. As the etching time duration is set according to the thick portion, the space 2011 can be reliably formed at the center portion and the peripheral portion of the wafer 200.

Next, another specific method for controlling the amount of the wafer 200 being etched will be described. In this method, the amount of the peripheral portion of the wafer 200 being etched is controlled to a larger amount than the amount of the center portion of the wafer 200. At this time, the amount or the like of etching gas supplied to the center portion of the wafer 200 is controlled to a smaller amount than the amount or the like of etching gas supplied to the peripheral portion of the wafer 200.

At this time, by controlling the opening degree of the valve 241c while the gas supply system controls the MFC 241b, the amount of etching gas supplied into the process chamber 201 through the shower head 234 is controlled. Furthermore, by controlling the opening degree of the valve 242c while controlling the MFC 242b, the etching gas is supplied into the process chamber 201 through the gas supply path 235. The amount of supplied etching gas is controlled such that the amount of exposure per unit area of the surface of the wafer 200 to the gas supplied through the shower head 234 becomes smaller than the amount of exposure per unit area of the surface of the wafer 200 to the gas supplied through the gas supply path 235.

The etching gas supplied through the shower head 234 is supplied onto the inter-wiring insulation film 2002a formed at the center portion of the wafer 200. As illustrated in FIG. 18, the supplied etching gas forms the trench 2009a while etching the inter-wiring insulation film 2002a.

The etching gas supplied through the gas supply path 235 is supplied onto the inter-wiring insulation film 2002b formed at the peripheral portion of the wafer 200. As illustrated in FIG. 18, the supplied etching gas forms the trench 2009b while etching the inter-wiring insulation film 2002b.

For the amount of exposure per unit area of the surface of the wafer 200 to the etching gas, the amount of exposure around the inter-wiring insulation film 2002b to the etching gas is greater than the amount of exposure around the inter-wiring insulation film 2002a to the etching gas. Therefore, the amount of the inter-wiring insulation film 2002b being etched can be controlled to a larger amount than the amount of the inter-wiring insulation film 2002a being etched.

At this time, as illustrated in FIGS. 18 and 10A, the etching time duration is adjusted to form the space 2011 in each of the trenches 2009a and 2009b. Thus, the space 2011 can be formed in the trench 2009 of the wafer 200, which makes it possible to provide a high-quality semiconductor device in which a leak current is suppressed.

When the supply of the etching gas is controlled, the respective electric potentials of the first and second bias electrodes 219a and 219b may be adjusted. For example, the high-frequency power supplies 221a and 221b are adjusted such that the electric potential of the second bias electrode 219b is lower than the electric potential of the first bias electrode 219a. When the electric potential of the second bias electrode 219b is lower than the electric potential of the first bias electrode 219a, the amount of ions supplied to the peripheral portion of the wafer 200 becomes greater than the amount of ions supplied to the center portion of the wafer 200. Therefore, the amount of the peripheral portion of the wafer 200 being etched can be controlled to a larger amount than the amount of the center portion of the wafer 200 being etched.

Therefore, the amount of exposure per unit area of the surface of the wafer 200 to the etching gas can be controlled such that the amount of etching gas supplied through the gas supply path 235 becomes greater than the amount of etching gas supplied through the shower head 234.

As for another method, the concentrations of the etching gases supplied to the gas supply pipes 241a and 242a may be controlled in a state where the amounts of etching gases supplied to the gas supply pipes 241a and 242a are adjusted to the same amount. When the concentrations of the etching gases are controlled, the concentrations of etching gases passing through the gas supply pipes 241a and 242a are controlled by controlling the inert gas supply system. In the case of the distribution B, the amount of inert gas supplied through the gas supply pipe 244a is adjusted to a smaller amount than the amount of inert gas supplied through the gas supply pipe 243a, such that the concentration of the etching gas passing through the gas supply pipe 242a is higher than the concentration of the etching gas passing through the gas supply pipe 241a.

More desirably, the concentrations may be adjusted to different values while the amounts of etching gases supplied to the gas supply pipes 241a and 242a are adjusted to different amounts. Such a control can supply the etching gases such that the amount of exposure per unit area of the center portion of the wafer 200 to the etching gas has a larger difference from the amount of exposure per unit area of the peripheral portion of the wafer 200 to the etching gas.

As described above, the amounts of the center portion and the peripheral portion of the wafer 200 being etched can be controlled by tuning the amount of etching gas per unit area of the wafer 200.

At this time, the etched amount and the etching time duration are controlled to form the space 2011 at the center portion and the peripheral portion of the wafer 200.

After the etching process is performed during a desired time, the wafer 200 is unloaded. At this time, the substrate placing table 212 is lowered to place the wafer 200 on the lift pins 207 protruding from the surface of the substrate placing table 212. Then, the wafer 200 is moved from the wafer process position to the wafer transfer position.

When the wafer 200 is moved to the wafer transfer position, the atmosphere of the transfer chamber 203 is exhausted to maintain the chamber 203 in a high-degree vacuum (ultra high-degree vacuum) state (for example, not more than $10^{-5}$ Pa), thereby reducing a pressure difference from the transfer chamber maintained in a high-degree vacuum (ultra high-degree vacuum) state (for example, not more than $10^{-6}$ Pa). When the pressure of the chamber 203 reaches a predetermined pressure, the wafer 200 is unloaded by an arm (not illustrated).

[Interlayer Insulation Film Forming Step S107]

Figure 19:
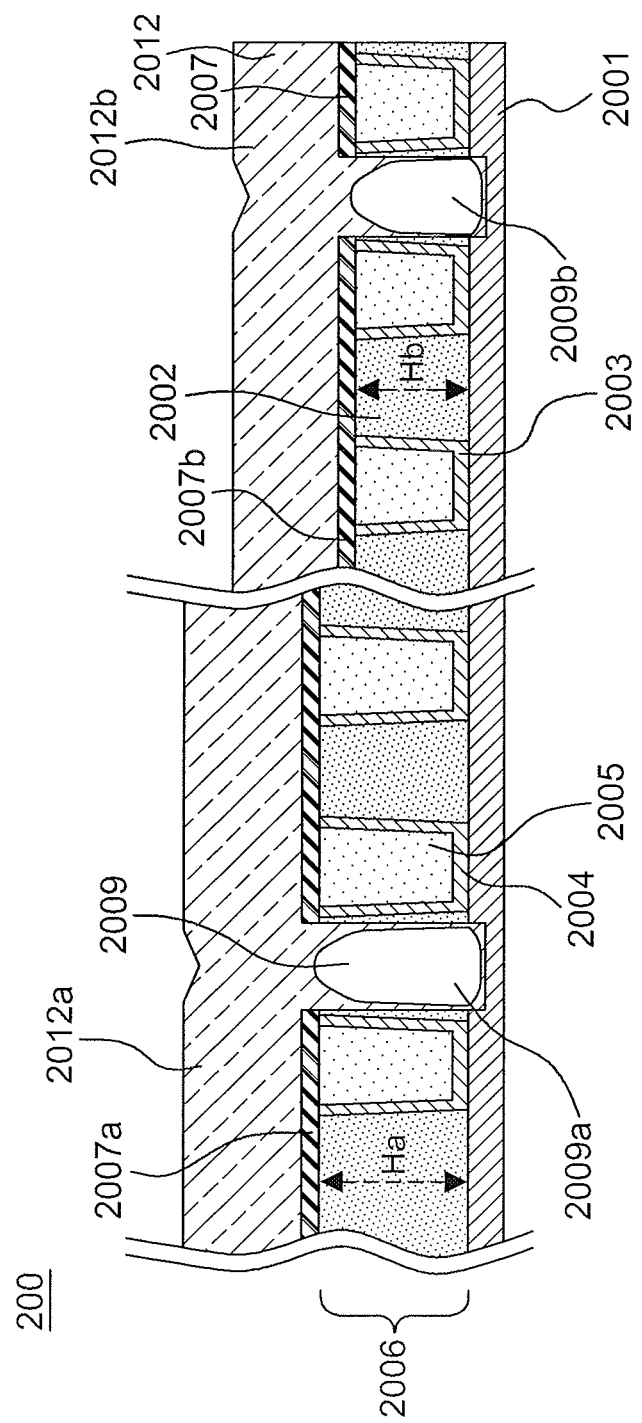
FIG. 19 is a diagram illustrating a processed state of the wafer according to the first embodiment described herein.

Next, an interlayer insulation film forming step S107 for forming the interlayer insulation film 2012 will be described. At this time, the distribution A illustrated in FIG. 19 will be described. When the void 2009 is formed by the etching process, the wafer 200 is moved to the substrate processing apparatus (not illustrated) for forming a second interlayer insulation film. As illustrated in FIG. 19, the second interlayer insulation film 2012 is formed on the diffusion prevention film 2007 by the substrate processing apparatus (not illustrated) for forming the second interlayer insulation film. The second interlayer insulation film 2012 is a carbon-containing silicon oxide film (SiOC film), for example. When the second interlayer insulation film 2012 is formed, a silicon-containing gas and an oxygen-containing gas may be supplied onto the wafer 200 and subjected to a gas phase reaction, and carbon doping may be then performed.

Next, the reason why the second interlayer insulation film 2012 can be formed while the void 2009 is secured through the interlayer insulation film forming step S107 will be described as follows. When a clearance between wirings is considerably small as described above, a portion around the upper portion of the diffusion prevention film 2007 may be clogged with deposits of the interlayer insulation film 2012. Then, a gas is hardly introduced downward. Thus, the deposition velocity at the lower portion of the void 2009 is slower than the deposition velocity at the upper portion of the diffusion prevention film 2007. In such a state, the film forming process is continuously performed to form the second interlayer insulation film 2012 while securing the void 2009. The secured void 2009 is used as an air gap. In the first embodiment, the interlayer insulation film 2012 at the center portion of the wafer 200 is referred to as an interlayer insulation film 2012a, and the interlayer insulation film 2012 at the peripheral portion of the wafer 200 is referred to as an interlayer insulation film 2012b. Through the above-described step, the air gap is formed.

Second Embodiment

Figure 20:
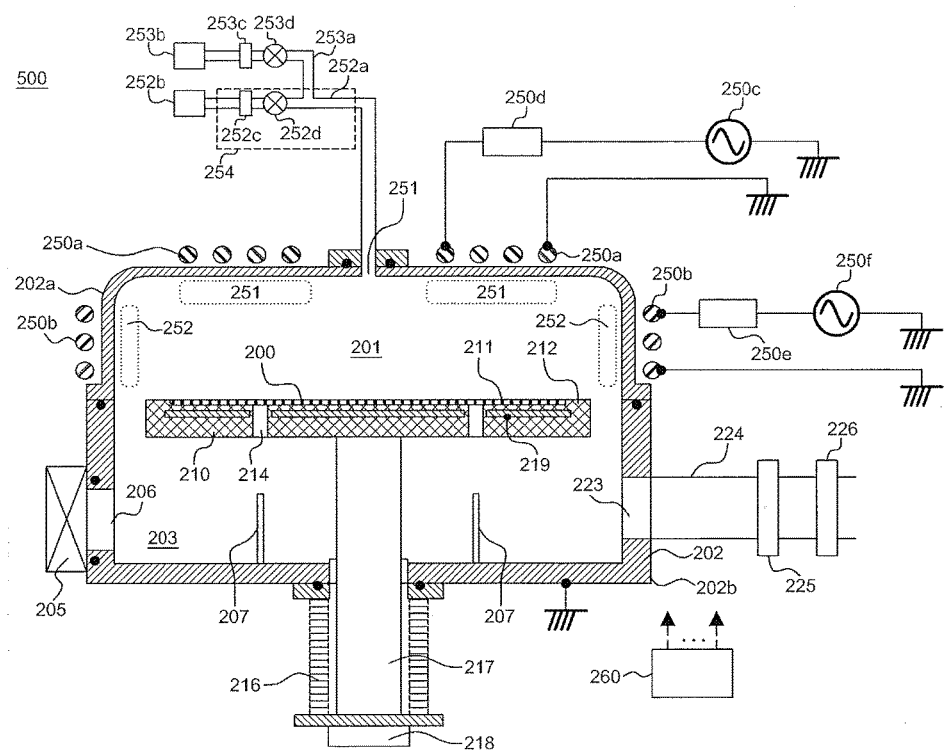
FIG. 20 is a diagram illustrating a substrate processing apparatus according to a second embodiment described herein.

Next, a second embodiment will be described. In the second embodiment, an etching apparatus used at the void forming step S106 is different from the etching apparatus used in the first embodiment. In the first embodiment, the etching process is performed by the substrate processing apparatus 100. In the second embodiment, however, the etching process is performed by a substrate processing apparatus 500 illustrated in FIG. 20. Hereafter, the substrate processing apparatus 500 will be described in detail. In FIG. 20, the same components as those of the first embodiment are denoted by like reference numerals, and the detailed descriptions thereof are omitted herein.

As illustrated in FIG. 20, the substrate processing apparatus 500 includes a process container 202. The process container 202 includes a transfer chamber 203 and a process chamber 201 where a wafer 200 such as a silicon substrate is processed. The process container 202 includes an upper container 202a and a lower container 202b. The lower container 202b is grounded.

(Substrate Support)

The process chamber 201 has a substrate support 210 installed therein, the substrate support 210 supporting the wafer 200. Since the substrate support (susceptor) 210 has the same configuration as the substrate support of the substrate processing apparatus 100 according to the first embodiment, the detailed descriptions thereof are omitted herein.

(Plasma Generation Unit)

Above the upper container 202a, a first coil 250a is installed as a first plasma generation unit (upper plasma generation unit). The first coil 250a is connected to a high-frequency power supply 250c through an impedance matching unit 250d. As high-frequency power is supplied to the first coil 250a, a gas supplied to the process chamber 201 may be excited to generate plasma. In particular, plasma is generated in a space (first plasma generation region 251) formed at the upper portion of the process chamber 201 and facing the wafer 200. The first plasma generation unit may be configured to generate plasma in a space facing the substrate placing table 212.

At the side of the upper container 202a, a second coil 250b is installed as a second plasma generation unit (side plasma generation unit). The second coil 250b is connected to a high-frequency power supply 250f through an impedance matching unit 250e. As high-frequency power is supplied to the second coil 250b, a gas supplied to the process chamber 201 may be excited to generate plasma. In particular, plasma is generated in a space (second plasma generation region 252) formed at the side portion of the process chamber 201 and being outer than the space facing the wafer 200. The second plasma generation unit may be configured to generate plasma in the space outer than the space facing the substrate placing table 212.

The first and second plasma generation units are collectively referred to as a plasma generation unit.

(Exhaust System)

The transfer chamber 203 [lower container 202b] has an exhaust port 223 for exhausting the atmosphere of the process chamber 201, the exhaust port 223 being installed at the inner wall of the transfer chamber 203. The exhaust port 223 is connected to an exhaust pipe 224. A pressure controller 225 and a vacuum pump 226 are sequentially connected in series to the exhaust pipe 224, the pressure controller 225 including an APC (Automatic Pressure Controller) for controlling the inner pressure of the process chamber 201. The exhaust system (exhaust line) is constituted by the exhaust port 223, the exhaust pipe 224 and the pressure controller 225. The exhaust system (exhaust line) may further include the vacuum pump 226.

The upper container 202a has a gas introduction port 251 for supplying various gases into the process chamber 201, the gas introduction port 251 being installed at the upper portion of the upper container 202a. The gas introduction port 251 is connected to a gas supply pipe 252a.

(Gas Supply Unit)

An etching gas is supplied mainly through an etching gas supply unit 254 including a gas supply pipe 252a.

From the upstream side to the downstream side of the gas supply pipe 252a, an etching gas supply source 252b, an MFC 252c serving as a flow rate controller, and a valve 252d serving as an opening/closing valve are sequentially installed at the gas supply pipe 252a.

The etching gas is supplied into the process chamber 201 through the MFC 252c, the valve 252d and the first gas supply pipe 252a from the etching gas supply source 252b.

The downstream end of an inert gas supply pipe 253a is connected to the downstream side from the valve 252d of the gas supply pipe 252a. From the upstream side toward the downstream side of the inert gas supply pipe 253a, an inert gas source 253b, an MFC 253c and a valve 253d serving as an opening/closing valve are sequentially installed at the inert gas supply pipe 253a. The inert gas is nitrogen ($N_2$) gas, for example.

The etching gas supply system 254 is constituted by the gas supply pipe 252a, the MFC 252c and the valve 252d. In the second embodiment, the etching gas supply system 254 is also referred to as the etching gas supply unit 254.

An inert gas supply unit is constituted by the inert gas supply pipe 253a, the MFC 253c and the valve 253d. The inert gas supply unit may further include the inert gas source 253b and the gas supply pipe 252a.

The etching gas supply unit may further include the etching gas supply source 252b and the inert gas supply unit.

(Control Unit)

Since a controller 260 according to the second embodiment is configured in the same manner as the controller 260 according to the first embodiment, the detailed descriptions thereof are omitted herein.

(Substrate Processing Method)

Next, a void forming method using the substrate processing apparatus 500 will be described. The void forming method is one of substrate processing methods. The substrate processing method is performed in the same manner as the first embodiment, except for the etching control value adjusting step S3006 and the etching gas supply step S3008. Hereafter, the substrate processing method according to the second embodiment will be described while being focused on the etching control value adjusting step S3006. In the following descriptions, the respective units constituting the substrate processing apparatus 500 are controlled by the controller 260.

Since the film thickness information receiving step S3002 and the substrate loading step S3004 are performed in the same manner as those of the first embodiment, the detailed descriptions thereof are omitted herein.

[Etching Control Value Adjusting Step S3006]

The CPU 260a reads film thickness information stored in the RAM 260b and an etching control value database stored in the memory device 260c. Then, the CPU 260a compares the film thickness information to the etching control value database, and extracts an etching control value according to the thickness film information.

After the substrate is loaded, the inside of the process chamber 201 is exhausted through the exhaust pipe 224 such that the inner pressure of the process chamber 201 becomes a predetermined degree of vacuum. At this time, the opening degree of the APC valve serving as the pressure controller 225 is feedback-controlled based on a pressure value measured by the pressure sensor.

After the wafer 200 is placed on the substrate support 210 and the inner atmosphere of the process chamber 201 is stabilized, the MFC 252c and the plasma generation unit 215 are activated, and the opening degree of the valve 252d is adjusted. At this time, the opening degree of the valve 253d may be adjusted at the same time as the MFC 253c is activated.

[Etching Gas Supply Step S3008]

First, high-frequency power supplied to each of the first and second coils 250a and 250b is adjusted. For example, the first and second high-frequency power supplies 250c and 250f are adjusted (controlled) such that the high-frequency power supplied to the first coil 250a is greater than the high-frequency power supplied to the second coil 250b.

The electric potentials of the first and second bias electrodes 219a and 219b may be adjusted. For example, the impedance matching units 220a and 220b are adjusted such that the electric potential of the first bias electrode 219a is lower than the electric potential of the second bias electrode 219b.

The MFC 252c or the valve 252d adjusted at the etching control value adjusting step S3006 is controlled to adjust the density (or amount) of plasma in the gas supplied to the center portion of the wafer 200 and the density (or amount) of plasma in the gas supplied to the peripheral portion of the wafer 200.

The etching gas in plasma state is supplied into the process chamber 201, and forms a void 2009.

After a predetermined time has elapsed, all of the valves are closed to stop the supply of gas.

Next, the etching control value adjusting step S3006 according to the second embodiment will be described in detail. After the polishing step S102 is ended as described above, the thickness of the inter-wiring insulation film 2002 at the center portion of the wafer 200 is different from the thickness of the inter-wiring insulation film 2002 at the peripheral portion of the wafer 200. At the measuring step S103, the thickness distribution of the inter-wiring insulation film 2002 is measured. The measurement result is stored in the RAM 260b through the upper apparatus 270. The stored data is compared to the recipe stored in the memory device 260c, and control is performed based on the recipe.

Next, the case in which the data stored in the RAM 260b follows the distribution A will be described.

In the case of the distribution A, the amount of the center portion of the wafer 200 being etched is controlled to a smaller amount than the amount of the peripheral portion of the wafer 200 being etched, at the etching gas supply step S3008. For example, the amount of supplied etching gas ranges from 10 sccm to 100 scm. Furthermore, an etching time duration is set according to an etching time duration of the thick portion, that is, the center portion of the wafer 200, as in the first embodiment. The etching time duration ranges from 30 to 120 seconds, for example.

Next, a specific method for controlling the amount of the wafer 200 being etched will be described. In this method, the amount of the center portion of the wafer 200 being etched is controlled to a larger amount than the amount of the peripheral portion of the wafer 200 being etched. In the following example, the amount or the like of etching gas in plasma state, supplied to the peripheral portion of the wafer 200, is controlled to a smaller amount than the amount or the like of etching gas in plasma state, supplied to the center portion of the wafer 200.

By controlling the MFC 252c of the etching gas supply system 254 while controlling the opening degree of the valve 252d, the etching gas is supplied into the process chamber 201. The etching gas is supplied in a state where high-frequency power supplied to the first coil 250a is set higher than high-frequency power supplied to the second coil 250b.

When the etching gas is supplied in a state where the high-frequency power supplied to the first coil 250a is higher than the high-frequency power supplied to the second coil 250b, the amount (or concentration) of active species supplied to the center portion of the wafer 200 can be controlled to a larger amount than the amount (or concentration) of active species supplied to the peripheral portion of the wafer 200. Therefore, the amount of the center portion of the wafer 200 being etched can be controlled to a larger amount than the amount of the peripheral portion of the wafer 200 being etched. As illustrated in FIG. 9, the supplied etching gas forms the trench 2009a by etching the inter-wiring insulation film 2002a, and forms the trench 2009b by etching the inter-wiring insulation film 2002b.

When the supply of the etching gas is controlled, the electric potentials of the first and second bias electrodes 219a and 219b may be adjusted. For example, the high-frequency power supplies 221a and 221b are adjusted such that the electric potential of the first bias electrode 219a is lower than the electric potential of the second bias electrode 219b. When the electric potential of the first bias electrode 219a is lower than the electric potential of the second bias electrode 219b, the amount of ions introduced to the center portion of the wafer 200 can be controlled to a larger amount than the amount of ions introduced to the peripheral portion of the wafer 200. Therefore, the amount of the center portion of the wafer 200 being etched can be controlled to a larger amount than the amount of the peripheral portion of the wafer 200 being etched.

As illustrated in FIGS. 9 and 10A, the etching time duration is adjusted to form a space 2011 in each of the trenches 2009a and 2009b. Thus, the space 2011 can be formed in the trench 2009 of the wafer 200, which makes it possible to provide a high-quality semiconductor device in which a leak current is suppressed.

Next, the case in which the data stored in the RAM 260b follows the distribution B will be described.

In the case of the distribution B, the amount of the center portion of the wafer 200 being etched is controlled to a larger amount than the amount of the peripheral portion of the wafer 200 being etched, at the etching gas supply step S3008. For example, the amount of supplied etching gas ranges from 10 sccm to 100 scm. The etching time duration is set according to the etching time duration of the thick portion, that is, the peripheral portion of the wafer 200. The etching time duration ranges from 30 to 120 seconds, for example.

Next, another specific method for controlling the amount of the wafer 200 being etched will be described. In this method, the amount of the peripheral portion of the wafer 200 being etched is controlled to a larger amount than the amount of the center portion of the wafer 200 being etched. In the following example, the amount or the like of etching gas in plasma state, supplied to the center portion of the wafer 200, is controlled to a larger amount than the amount or the like of etching gas in plasma state, supplied to the peripheral portion of the wafer 200.

By controlling the opening degree of the valve 252d while controlling the MFC 252c of the etching gas supply system 254, the etching gas is supplied into the process chamber 201. The etching gas is supplied in a state where high-frequency power supplied to the second coil 250b is set higher than high-frequency power supplied to the first coil 250a.

When the etching gas is supplied in a state where the high-frequency power supplied to the second coil 250b is higher than the high-frequency power supplied to the first coil 250a, the amount (or concentration) of active species supplied to the peripheral portion of the wafer 200 can be controlled to a larger amount than the amount (or concentration) of active species supplied to the center portion of the wafer 200. Therefore, the amount of the peripheral portion of the wafer 200 being etched can be controlled to a larger amount than the amount of the center portion of the wafer 200 being etched. As illustrated in FIG. 18, the supplied etching gas forms the trench 2009a by etching the inter-wiring insulation film 2002a, and forms the trench 2009b by etching the inter-wiring insulation film 2002b.

As illustrated in FIGS. 18 and 10A, the etching time duration is adjusted to form the space 2011 in each of the trenches 2009a and 2009b. Thus, the space 2011 can be formed in the trench 2009 of the wafer 200, which makes it possible to provide a high-quality semiconductor device in which a leak current is suppressed.

When the supply of the etching gas is controlled, the electric potentials of the first and second bias electrodes 219a and 219b may be adjusted. For example, the high-frequency power supplies 221a and 221b are adjusted such that the electric potential of the second bias electrode 219b is lower than the electric potential of the first bias electrode 219a. When the electric potential of the second bias electrode 219b is lower than the electric potential of the first bias electrode 219a, the amount of ions introduced to the peripheral portion of the wafer 200 can be controlled to a larger amount than the amount of ions introduced to the center portion of the wafer 200. Therefore, the amount of the peripheral portion of the wafer 200 being etched can be controlled to a larger amount than the amount of the center portion of the wafer 200 being etched.

After the etching process is performed for a desired time, the substrate unloading step S3010 is performed.

According to the technique described based on the above embodiments, it is possible to manufacture a semiconductor device capable of suppressing a leak current while having an air gap. Thus, a satisfactory yield can be obtained.

According to the technique described herein, it is possible to provide a technique capable of obtaining a satisfactory yield for a semiconductor device with an air gap.

What is claimed is:

1. A method of manufacturing a semiconductor device, comprising:
   (a) receiving a thickness information of a wiring layer formed on a substrate comprising: a first interlayer insulation film; and the wiring layer disposed on the first interlayer insulation film, the wiring layer comprising: copper-containing films used as wiring; and an inter-wiring insulation film having trenches filled with the copper-containing films and insulating the copper-containing films;

(b) placing the substrate on a substrate support installed in a process chamber; and (c) etching the wiring layer using an etching gas based on an etching control value corresponding to the thickness information of the wiring layer.

2. The method of claim 1, wherein the etching control value includes an etching time duration and the etching time duration is set such that the wiring layer is etched to a depth deeper than a bottom of the trenches.

3. The method of claim 1, wherein the thickness information comprises a thickness of the inter-wiring insulation film.

4. The method of claim 3, wherein the thickness information comprises a thickness of the wiring layer after the copper-containing films are polished.

5. The method of claim 1, wherein the thickness information comprises a thickness of the wiring layer after the copper-containing films are polished.

6. The method of claim 1, wherein the thickness information comprises thicknesses of the wiring layer at a center portion and a peripheral portion of the substrate, and wherein an amount of exposure to the etching gas per unit area of the center portion is greater than an amount of exposure to the etching gas per unit area of the peripheral portion in the step (c) when the thickness information indicates the thickness of the wiring layer at the center portion is greater than the thickness of the wiring layer at the peripheral portion, and the amount of exposure to the etching gas per unit area of the peripheral portion is greater than the amount of exposure to the etching gas per unit area of the center portion in the step (c) when the thickness information indicates the thickness of the wiring layer at the peripheral portion is greater than the thickness of the wiring layer at the center portion.

7. The method of claim 6, wherein the thickness information comprises a thickness of the wiring layer after the copper-containing films are polished.

8. The method of claim 1, wherein the thickness information comprises thicknesses of the wiring layer at a center portion and a peripheral portion of the substrate, and wherein an amount of the etching gas supplied to the center portion is greater than an amount of the etching gas supplied to the peripheral portion in the step (c) when the thickness information indicates the thickness of the wiring layer at the center portion is greater than the thickness of the wiring layer at the peripheral portion, and the amount of the etching gas supplied to the peripheral portion is greater than the amount of the etching gas supplied to the center portion in the step (c) when the thickness information indicates the thickness of the wiring layer at the peripheral portion is greater than the thickness of the wiring layer at the center portion.

9. The method of claim 8, wherein the thickness information comprises a thickness of the wiring layer after the copper-containing films are polished.

10. The method of claim 1, wherein the thickness information comprises thicknesses of the wiring layer at a center portion and a peripheral portion of the substrate, and wherein a concentration of the etching gas supplied to the center portion is greater than a concentration of the etching gas supplied to the peripheral portion in the step (c) when the thickness information indicates the thickness of the wiring layer at the center portion is greater than the thickness of the wiring layer at the peripheral portion, and the concentration of the etching gas supplied to the peripheral portion is greater than the concentration of the etching gas supplied to the center portion in the step (c) when the thickness information indicates the thickness of the wiring layer at the peripheral portion is greater than the thickness of the wiring layer at the center portion.

11. The method of claim 10, wherein the thickness information comprises a thickness of the wiring layer after the copper-containing films are polished.

12. The method of claim 10, wherein the concentrations of the etching gas supplied to the peripheral portion and the center portion are controlled by controlling an amount of an inert gas added to the etching gas.

13. The method of claim 12, wherein the thickness information comprises a thickness of the wiring layer after the copper-containing films are polished.

14. The method of claim 1, wherein the thickness information comprises thicknesses of the wiring layer at a center portion and a peripheral portion of the substrate, wherein a plasma density of the etching gas supplied to the center portion is greater than a plasma density of the etching gas supplied to the peripheral portion in the step (c) when the thickness information indicates the thickness of the wiring layer at the center portion is greater than the thickness of the wiring layer at the peripheral portion, and the plasma density of the etching gas supplied to the peripheral portion is greater than the plasma density of the etching gas supplied to the center portion in the step (c) when the thickness information indicates the thickness of the wiring layer at the peripheral portion is greater than the thickness of the wiring layer at the center portion.

15. The method of claim 14, wherein the thickness information comprises a thickness of the wiring layer after the copper-containing films are polished.

16. The method of claim 14, wherein an electric potential of a bias electrode installed at a center portion of the substrate support is lower than an electric potential of a bias electrode installed at a peripheral portion of the substrate support in the step (c) when the thickness information indicates the thickness of the wiring layer at the center portion of the substrate is greater than the thickness of the wiring layer at the peripheral portion of the substrate, and the electric potential of the bias electrode installed at the peripheral portion of the substrate support is lower than the electric potential of the bias electrode installed at the center portion of the substrate support in the step (c) when the thickness information indicates the thickness of the wiring layer at the peripheral portion of the substrate is greater than the thickness of the wiring layer at the center portion of the substrate.

17. The method of claim 16, wherein the thickness information comprises a thickness of the wiring layer after the copper-containing films are polished.

* * * * *